(12) United States Patent
Kuo et al.

(10) Patent No.: US 11,728,789 B2
(45) Date of Patent: Aug. 15, 2023

(54) VOLTAGE SUPPLY SELECTION CIRCUIT

(71) Applicant: Taiwan Semiconductor Manufacturing Co., Ltd., Hsinchu (TW)

(72) Inventors: Chia-Chen Kuo, Hsinchu (TW); Yangsyu Lin, New Taipei (TW); Yu-Hao Hsu, Tainan (TW); Cheng Hung Lee, Hsinchu (TW); Hung-Jen Liao, Hsin-Chu (TW); Jonathan Tsung-Yung Chang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 17/406,273

(22) Filed: Aug. 19, 2021

(65) Prior Publication Data

US 2023/0054498 A1 Feb. 23, 2023

(51) Int. Cl.
*H03K 3/012* (2006.01)

(52) U.S. Cl.
CPC .................... *H03K 3/012* (2013.01)

(58) Field of Classification Search
CPC ...................................................... H03K 3/012
See application file for complete search history.

(56) References Cited

U.S. PATENT DOCUMENTS

| | | | |
|---|---|---|---|
| 10,775,818 B2* | 9/2020 | Tiedemann | H02H 9/04 |
| 2013/0030574 A1* | 1/2013 | Storm | F24F 11/30 |
| | | | 702/64 |
| 2017/0244405 A1* | 8/2017 | Rachupalli | G06K 19/0723 |
| 2018/0294785 A1* | 10/2018 | Tseng | H03F 3/45475 |
| 2022/0166429 A1* | 5/2022 | Lee | H02M 3/07 |
| 2022/0208136 A1* | 6/2022 | Tsuchi | G09G 3/3614 |

* cited by examiner

*Primary Examiner* — Sibin Chen
(74) *Attorney, Agent, or Firm* — Sterne, Kessler, Goldstein & Fox P.L.L.C.

(57) ABSTRACT

The present disclosure describes an example circuit for selecting a voltage supply. The circuit includes a first control switch, a first voltage supply switch, a second control switch, and a second voltage supply switch. The first control switch is configured to receive a control signal and a first voltage supply. The first voltage supply switch is electrically coupled to the first control switch and is configured to receive a second voltage supply. The second voltage supply switch is electrically coupled to the second control switch and configured to receive the first voltage supply. The first and second voltage supply switches are configured to selectively output the first and second voltage supplies based on the control signal.

20 Claims, 14 Drawing Sheets

VOLTAGE SUPPLY SELECTION CIRCUIT

BACKGROUND

Voltage scaling is a power management technique used in integrated circuit (IC) design, where a voltage supply can be increased or decreased. For example, in a processor with multiple functional units, a power supply voltage for idle units may be set to a voltage level less than that for active units. As a result, the processor's power consumption can be reduced while increasing performance for active units.

BRIEF DESCRIPTION OF THE DRAWINGS

Aspects of the present disclosure are best understood from the following detailed description when read with the accompanying figures. It is noted that, according to the standard practice in the industry, various features are not drawn to scale. In fact, the dimensions of the various features may be arbitrarily increased or reduced for clarity of discussion.

DETAILED DESCRIPTION

Figure 1:
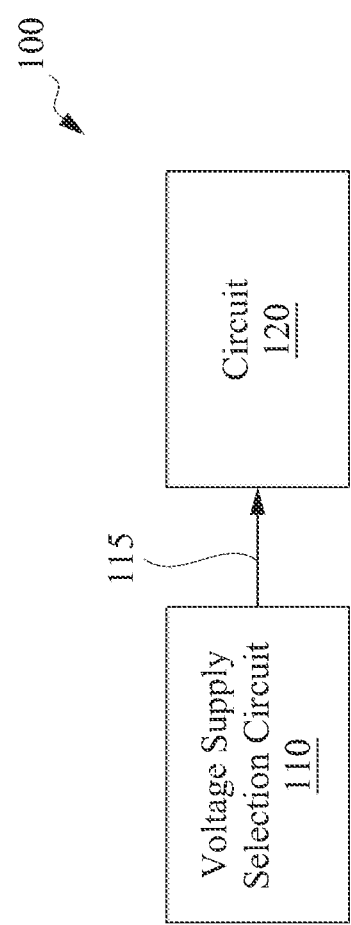
FIG. 1 is an illustration of a system for selecting a voltage supply, according to some embodiments of the present disclosure.

The following disclosure provides many different embodiments, or examples, for implementing different features of the provided subject matter. Specific examples of components and arrangements are described below to simplify the present disclosure. These are merely examples and are not intended to be limiting. In addition, the present disclosure repeats reference numerals and/or letters in the various examples. This repetition is for the purpose of simplicity and clarity and, unless indicated otherwise, does not in itself dictate a relationship between the various embodiments and/or configurations discussed.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in the relevant art in light of the teachings herein.

Embodiments of the present disclosure describe a voltage supply selection circuit that can increase or decrease a supply voltage depending on a selection signal (or control signal). For example, when increasing a voltage supply to support a system's high performance mode operation (e.g., at a higher frequency to execute circuit operations faster), embodiments of the present disclosure increase a single supply voltage—rather than increase multiple supply voltages—thus simplifying circuit design. And, when decreasing the voltage supply to reduce a system's power consumption, embodiments of the present disclosure decrease a single supply voltage—rather than decrease multiple supply voltages—thus again simplifying circuit design.

FIG. 1 is an illustration of a system 100 for selecting a voltage supply, according to some embodiments of the present disclosure. System 100 includes a voltage supply selection circuit 110 and a circuit 120. In some embodiments, circuit 120 can be a processor device (e.g., a central processing unit (CPU) device and a graphics processing unit (GPU) device), a memory device (e.g., a dynamic random access memory (DRAM) device and a static random access memory (SRAM) device), an input/output interface device (e.g., a peripheral component interface (PCI) device and a serializer/deserializer (SerDes) device), or any other type of device that can implement voltage scaling techniques.

In some embodiments, voltage supply selection circuit 110 provides a voltage supply 115 to circuit 120. Voltage supply 115 can be a power supply voltage, such as a power supply voltage associated with logic devices ("$V_{DD}$") or a power supply voltage associated with memory device operations ("$V_{DDM}$"), according to some embodiments of the present disclosure. The $V_{DD}$ voltage level can be, for example, within a range of about 0.4 V to about 5.0 V. Other values are within the spirt and scope of the present disclosure. The $V_{DDM}$ voltage level can be, for example, within a range of about 0.6 V to about 2.0 V. Other values are within the spirit and scope of the present disclosure. In some embodiments, the $V_{DD}$ voltage level can be lower than the $V_{DDM}$ voltage level during a normal mode of operation for system 100 (e.g., when system 100 is not in a high performance mode of operation). When system 100 is in a high performance mode of operation, the $V_{DD}$ voltage level can transition to a higher voltage level than that of the $V_{DDM}$ voltage level. The $V_{DDM}$ voltage level can remain substantially the same during the normal and high performance modes of operation for system 100, according to some embodiments of the present disclosure. Though the description below refers to $V_{DD}$ and $V_{DDM}$ as voltage supplies for example purposes, other voltage supplies can be used with the embodiments described herein. These other voltage supplies are within the spirit and scope of the present disclosure.

Voltage supply selection circuit 110 can provide multiple voltage levels of voltage supply 115—e.g., $V_{DD}$ and $V_{DDM}$—to circuit 120 based on a selection signal (not shown in FIG. 1; described below with regard to selection signal 210 of FIG. 2). In some embodiments, voltage supply selection circuit 110 provides a voltage scaling functionality to circuit 120, in which circuit 120 can receive one of two voltage supplies (e.g., $V_{DD}$ or $V_{DDM}$) to facilitate a high performance mode of operation and to manage power consumption in circuit 120. For example, when circuit 120 requires a higher voltage supply to facilitate a high performance mode of operation (e.g., at a higher frequency to execute circuit operations faster), voltage supply selection circuit 110 can provide a higher voltage level of voltage supply 115 (e.g., $V_{DD}$ transitioning from a lower to higher voltage level; described below with regard to second voltage supply 270 of FIG. 2) to circuit 120. When circuit 120 is not in a high performance mode of operation and reduce power consumption, voltage supply selection circuit 110 can provide a lower voltage level of voltage supply 115 (e.g., $V_{DDM}$; described below with regard to first voltage supply 260 of FIG. 2) to circuit 120. In some embodiments, the higher and lower voltage levels of voltage supply 115 (e.g., $V_{DD}$ and $V_{DDM}$) can be based on the selection signal (e.g., selection signal 210 of FIG. 2).

Figure 2:
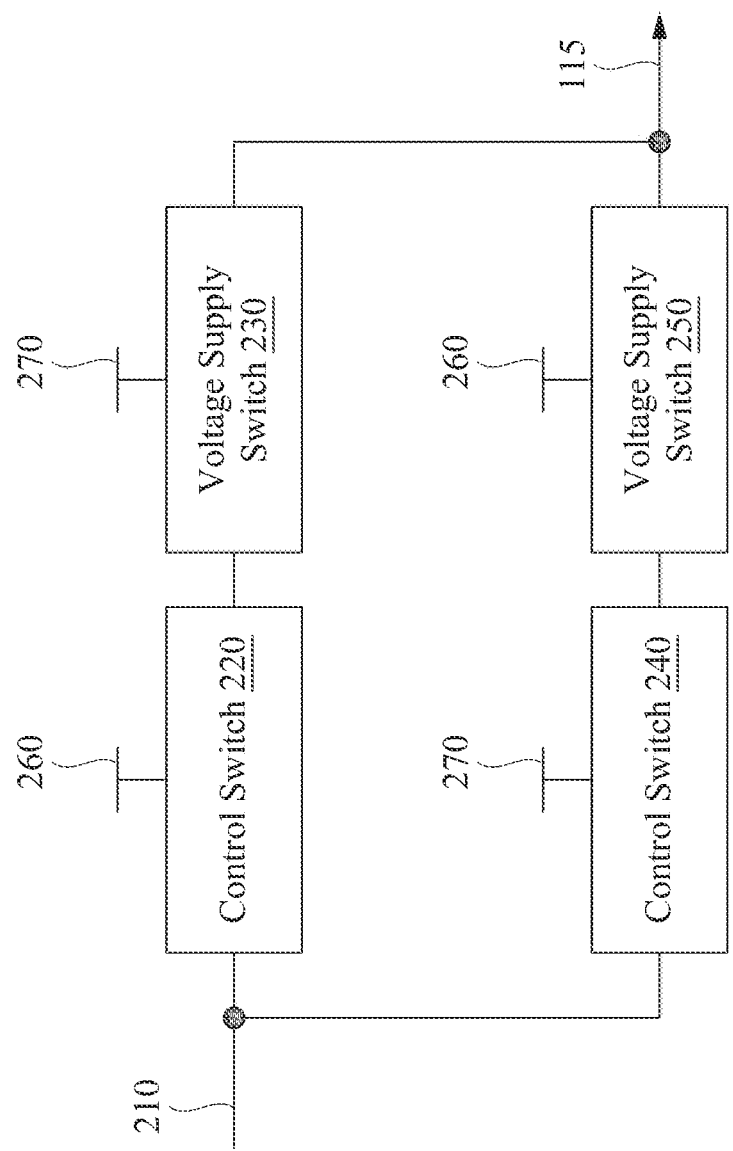
FIG. 2 is an illustration of a voltage supply selection circuit, according to some embodiments of the present disclosure.

FIG. 2 is an illustration of voltage supply selection circuit 110, according to some embodiments of the present disclosure. Voltage supply selection circuit 110 includes a first control switch 220, a first voltage supply switch 230, a second control switch 240, and a second voltage supply switch 250. Voltage supply selection circuit 110 receives (or is electrically coupled to) a selection signal 210 (also referred to herein as "a control signal 210") as an input. In some embodiments, selection signal 210 can be provided to voltage supply selection circuit 110 by circuit 120 of FIG. 1 or by another circuit not shown in system 100 of FIG. 1. In some embodiments, based on selection signal 210, voltage supply selection circuit 110 can output either a first voltage supply 260 or a second voltage supply 270 at voltage supply 115. First voltage supply 260 can be $V_{DDM}$ and second voltage supply 270 can be $V_{DD}$, according to some embodiments of the present disclosure.

First control switch 220 receives (or is electrically coupled to) selection signal 210 as an input and first voltage supply 260 as a power supply voltage, according to some embodiments of the present disclosure. First control switch 220 controls an output of first voltage supply switch 230—which receives (or is electrically coupled to) second voltage supply 270 as a power supply voltage—based on selection signal 210. For example, based on selection signal 210, first control switch 220 can control first voltage supply switch 230 to pass second voltage supply 270 (e.g., $V_{DD}$) to voltage supply 115.

Second control switch 240 also receives (or is electrically coupled to) selection signal 210 as an input and second voltage supply 270 as a power supply voltage, according to some embodiments of the present disclosure. Second control switch 240 controls an output of second voltage supply switch 250—which receives (or is electrically coupled to) first voltage supply 260 as a power supply voltage—based on selection signal 210. For example, based on selection signal 210, second control switch 240 can control second voltage supply switch 250 to pass first voltage supply 260 (e.g., $V_{DDM}$) to voltage supply 115. In some embodiments, if second control switch 240 controls second voltage supply switch 250 to pass first voltage supply 260, first control switch 220 controls first voltage supply switch 230 to prevent from passing second voltage supply 270 to voltage supply 115—and vice versa.

Figure 3:
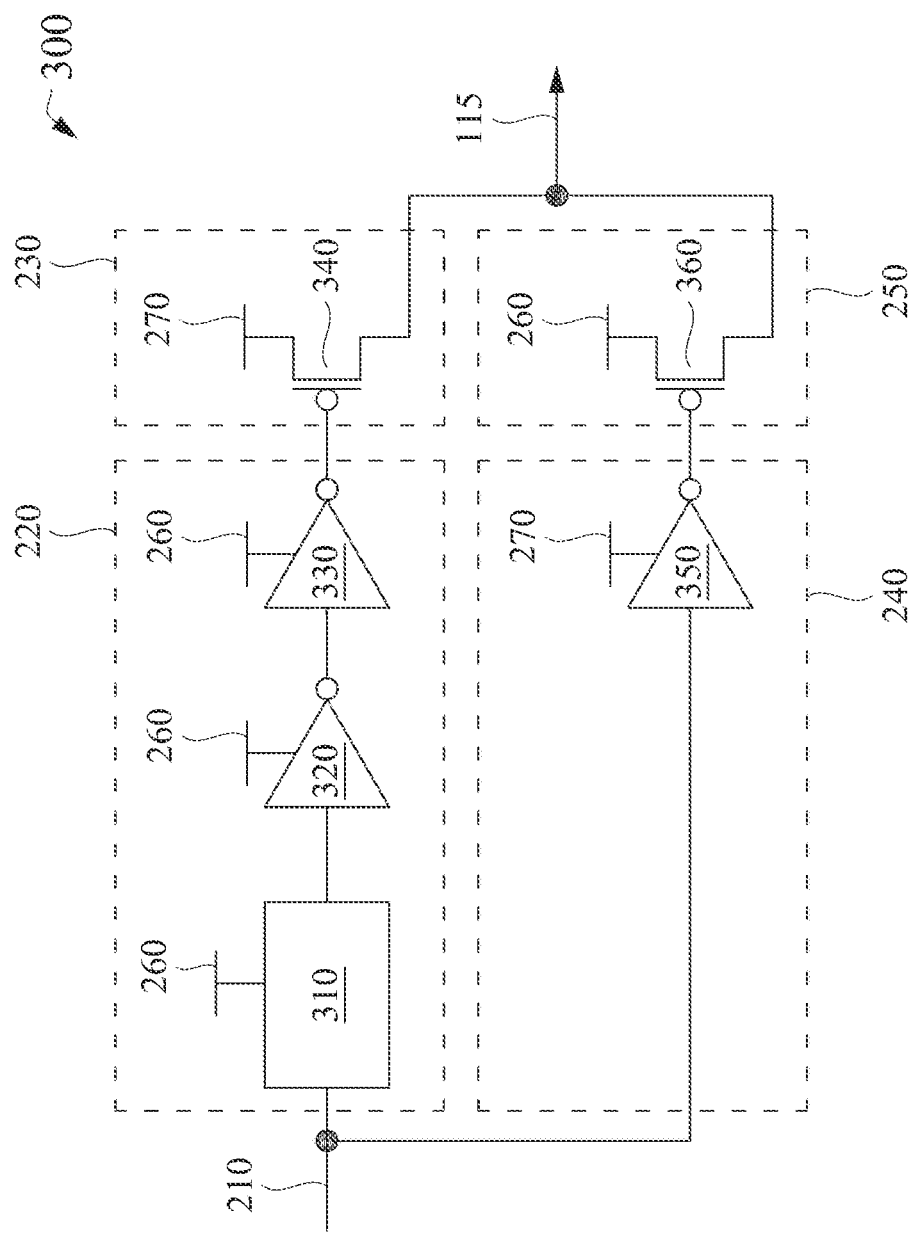
FIG. 3 is an illustration of a first circuit-level representation of a voltage supply selection circuit, according to some embodiments of the present disclosure.

FIG. 3 is an illustration of a first circuit-level representation of a voltage supply selection circuit 300, according to some embodiments of the present disclosure. Voltage supply selection circuit 300 can represent voltage supply selection circuit 110 of FIGS. 1 and 2. In this example, selection signal 210 is in the voltage domain of second voltage supply 270 (e.g., $V_{DD}$ voltage domain). For example, when selection signal 210 is at a logic high, selection signal 210 is at the voltage level of second voltage supply 270 (e.g., $V_{DD}$ voltage level). And, when selection signal 210 is at a logic low, selection signal 210 is at ground (e.g., 0 V).

First control switch 220 includes a level-shifter circuit 310, a first inverter circuit 320, and a second inverter circuit 330, in which power supplies of these circuits are electrically coupled to first voltage supply 260. Level-shifter circuit 310 receives (or is electrically coupled to) selection signal 210. In some embodiments, level-shifter circuit 310 sets a voltage level of selection signal 210 to be in the same voltage domain as first voltage supply 260 (e.g., $V_{DDM}$ voltage domain) at its output. For example, if selection signal 210 is at a logic high (e.g., $V_{DD}$ voltage level), level-shifter circuit 310 outputs a logic high in the voltage domain of first voltage supply 260 (e.g., $V_{DDM}$ voltage level). Conversely, if selection signal 210 is at a logic low (e.g., 0 V), level-shifter circuit 310 outputs ground (e.g., 0 V). First inverter circuit 320 receives (or is electrically coupled to) and inverts the output of level-shifter circuit 310. Second inverter circuit 330 receives (or is electrically coupled to) and inverts an output of first inverter circuit 320.

First voltage supply switch 230 includes a p-type transistor 340, with a gate terminal, a first source/drain (S/D) terminal, and a second S/D terminal. The gate terminal receives (or is electrically coupled to) an output of first control switch 220. The first S/D terminal receives (or is electrically coupled to) second voltage supply 270. The second S/D terminal outputs (or is electrically coupled to) voltage supply 115.

Second control switch 240 includes a third inverter circuit 350. Third inverter circuit 350 receives (or is electrically coupled to) selection signal 210 and receives (or is electrically coupled to) second voltage supply 270. Third inverter circuit 350 inverts selection signal 210. Second voltage supply switch 250 includes a p-type transistor 360, with a gate terminal, a first S/D terminal, and a second S/D terminal. The gate terminal receives (or is electrically coupled to) an output of second control switch 240. The first S/D terminal receives (or is electrically coupled to) first voltage supply 260. The second S/D terminal outputs (or is electrically coupled to) voltage supply 115.

Figure 4:
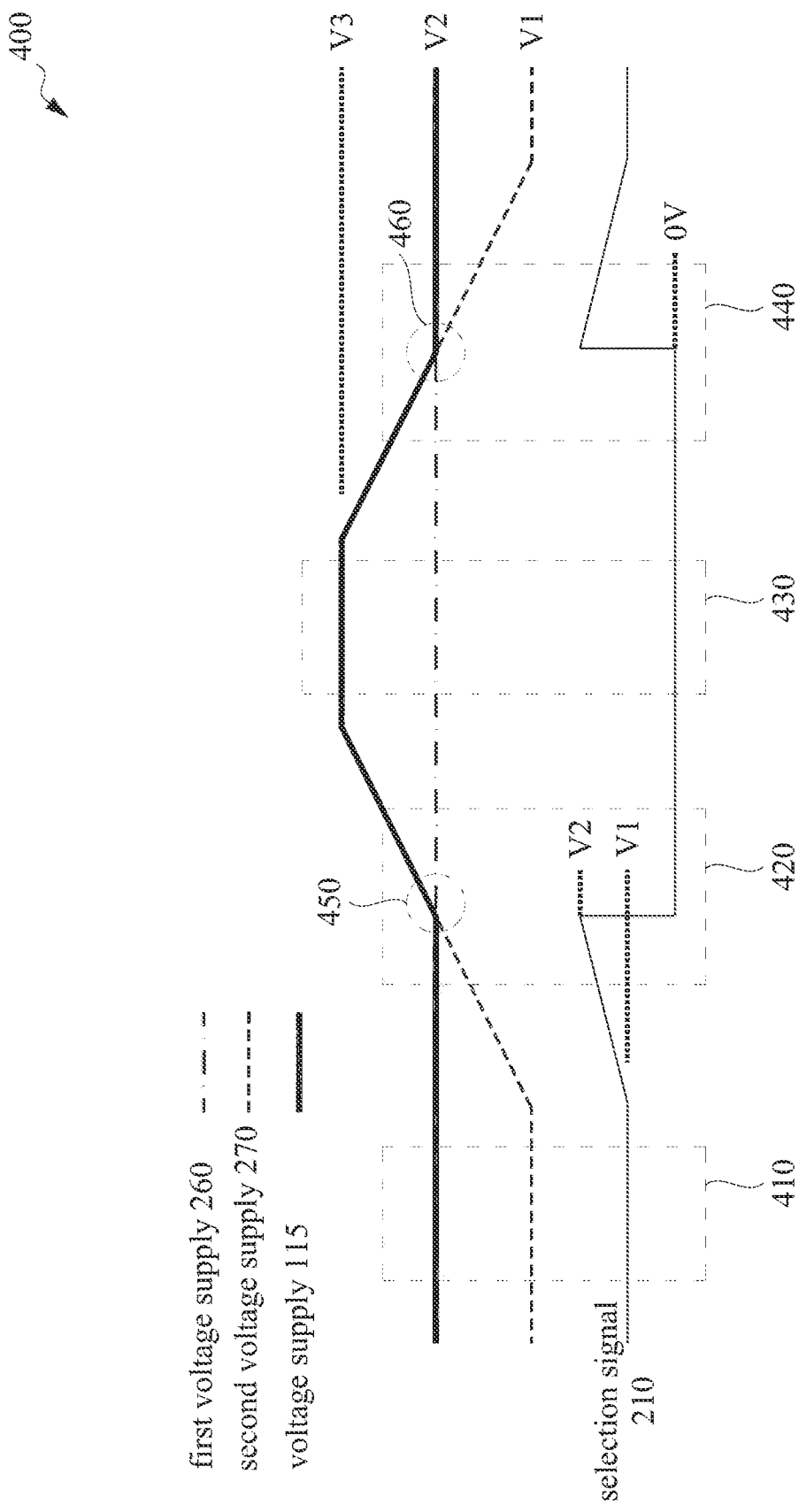
FIG. 4 is an illustration of example waveforms for a first circuit-level representation of a voltage supply selection circuit, according to some embodiments of the present disclosure.

FIG. 4 is an illustration of example waveforms 400 for voltage supply selection circuit 300, according to some embodiments of the present disclosure. As discussed above, for voltage supply selection circuit 300, selection signal 210 is in the voltage domain of second voltage supply 270 (e.g., $V_{DD}$ voltage domain). In waveforms 400, voltage V1 represents a voltage level of second voltage supply 270 when system 100 of FIG. 1 is in a normal mode of operation (e.g., when system 100 is not in a high performance mode of operation), voltage V2 represents a voltage level of first voltage supply 260, and voltage V3 represents a voltage level of second voltage supply 270 when system 100 is in the high performance mode of operation (e.g., to support a higher frequency to execute circuit operations faster). Voltage V3 can be at a voltage level higher than that of voltage V2, which can be at a voltage level higher than that of voltage V1. In some embodiments, the voltage level of first voltage supply 260 is substantially the same during the normal and high performance modes of operation for system 100.

During a time window 410, selection signal 210 is at a logic high (e.g., voltage V1) and system 100 is in a normal mode of operation. Under these conditions, voltage supply 115 is electrically coupled to first voltage supply 260. Referring to FIG. 3, with selection signal 210 at a logic high (e.g., voltage V1), second control switch 240 outputs a logic low (e.g., 0 V). Specifically, third inverter circuit 350 receives selection signal 210 and outputs a logic low (e.g., 0 V). Second voltage supply switch 250 receives the logic low output from second control switch 240 and passes first voltage supply 260 to voltage supply 115. Specifically, p-type transistor 360 receives the logic low (e.g., 0 V) output from third inverter circuit 350 at its gate terminal. As a result, p-type transistor 360 is on and passes first voltage supply 260 (e.g., voltage V2) to voltage supply 115.

Further, with selection signal 210 at a logic high (e.g., voltage V1), first control switch 220 outputs a logic high (e.g., first voltage supply 260). Specifically, level-shifter circuit 310 receives a logic high from selection signal 210 (which is in the voltage domain of second voltage supply 270) and outputs a logic high in the voltage domain of first voltage supply 260. In turn, first inverter circuit 320 receives the logic high output from level-shifter circuit 310 and outputs a logic low (e.g., 0 V). Second inverter circuit 330 receives the logic low output from first inverter circuit 320 and outputs a logic high (e.g., voltage V2).

First voltage supply switch 230 receives the logic high output from first control switch 220, which prevents second voltage supply 270 from being passed to voltage supply 115. Specifically, p-type transistor 340 receives the logic high (e.g., voltage V2) output from second inverter circuit 330 at its gate terminal. Because the first S/D terminal receives second voltage supply 270, which is lower than voltage V2 at the gate of p-type transistor 340, p-type transistor 340 is off and does not pass second voltage supply 270 to voltage supply 115.

During a time window 420, selection signal 210 transitions from a logic high to a logic low and second voltage supply 270 transitions from voltage V1 to voltage V3 in preparation for a high performance mode of operation for system 100. Because selection signal 210 is in the voltage domain of second voltage supply 270 (e.g., $V_{DD}$ voltage domain), as second voltage supply 270 transitions from voltage V1 to voltage V3, selection signal 210 transitions in a similar manner while selection signal 210 is at a logic high. In some embodiments, selection signal 210 transitions from a logic high (e.g., voltage V2) to a logic low (e.g., 0 V) at a time 450, which is a time when first voltage supply 260 and second voltage supply 270 are substantially at the same voltage level.

Referring to FIG. 3, with selection signal 210 at a logic low (e.g., 0 V), first control switch 220 outputs a logic low (e.g., 0 V). Specifically, level-shifter circuit 310 receives a logic low from selection signal 210 and outputs a logic low (e.g., 0 V). In turn, first inverter circuit 320 receives the logic low output from level-shifter circuit 310 and outputs a logic high (e.g., first voltage supply 260). Second inverter circuit 330 receives the logic high output from first inverter circuit 320 and outputs a logic low (e.g., 0 V). First voltage supply switch 230 receives the logic low output from first control switch 220 and passes second voltage supply 270 to voltage supply 115. Specifically, p-type transistor 340 receives the logic low (e.g., 0 V) output from second inverter circuit 330 at its gate terminal. As a result, p-type transistor 340 is on and passes second voltage supply 270 transitioning from voltage V1 to voltage V3) to voltage supply 115.

Further, with selection signal 210 at a logic low (e.g., 0 V), second control switch 240 outputs a logic high (e.g., second voltage supply 270), Specifically, third inverter circuit 350 receives selection signal 210 and outputs a logic high (e.g., second voltage supply 270). Second voltage supply switch 250 receives the logic high output from second control switch 240, which prevents first voltage supply 260 from being passed to voltage supply 115. Specifically, p-type transistor 360 receives the logic high (e.g., second voltage supply 270) output from third inverter circuit 350 at its gate terminal. At time 450 of FIG. 4, first voltage supply 260 and second voltage supply 270 are at or at substantially the same voltage level. As a result, p-type transistor 360 is off and does not pass first voltage supply 260 to voltage supply 115.

During a time window 430, selection signal 210 is at a logic low and second voltage supply 270 is at voltage V3. Because second voltage supply 270 is passed to voltage supply 115 via first voltage supply switch 230, voltage supply 115 is at voltage V3. As a result, circuit 120 of FIG. 1 receives a higher voltage supply to facilitate a high performance mode of operation, where it can operate at a higher frequency to execute circuit operations faster.

During a time window 440, selection signal 210 transitions from a logic low to a logic high and second voltage supply 270 transitions from voltage V3 to voltage V1 in preparation for a normal mode of operation for system 100. In some embodiments, selection signal 210 transitions from a logic low to a logic high at a time 460, which is a time when first voltage supply 260 and second voltage supply 270 are substantially at the same voltage level. Because selection signal 210 is in the voltage domain of second voltage supply 270 (e.g., $V_{DD}$ voltage domain), as second voltage supply 270 transitions from voltage V3 to voltage V1, selection signal 210 transitions in a similar manner while selection signal 210 is at a logic high.

Referring to FIG. 3, with selection signal 210 at a logic high, first control switch 220 outputs a logic high (e.g., first voltage supply 260). Specifically, level-shifter circuit 310 receives a logic high from selection signal 210 and outputs a logic high (e.g., first voltage supply 260). In turn, first inverter circuit 320 receives the logic high output from level-shifter circuit 310 and outputs a logic low (e.g., 0 V). Second inverter circuit 330 receives the logic low output from first inverter circuit 320 and outputs a logic high (e.g., first voltage supply 260). First voltage supply switch 230 receives the logic high output from first control switch 220, which prevents second voltage supply 270 from being passed to voltage supply 115. Specifically, p-type transistor 340 receives the logic high (e.g., first voltage supply 260) output from second inverter circuit 330 at its gate terminal. At time 460 of FIG. 4, first voltage supply 260 and second voltage supply 270 are at the same or substantially the same voltage level. As a result, p-type transistor 340 is off and prevents second voltage supply 270 (e.g., transitioning from voltage V3 to voltage V1) from being passed to voltage supply 115.

Further, with selection signal 210 at a logic high, second control switch 240 outputs a logic low (e.g., 0 V). Specifically, third inverter circuit 350 receives selection signal 210 and outputs a logic low (e.g., 0 V). Second voltage supply switch 250 receives the logic low output from second control switch 240 and passes first voltage supply 260 to voltage supply 115. Specifically, p-type transistor 360 receives the logic low (e.g., 0 V) output from third inverter circuit 350 at its gate terminal. As a result, p-type transistor 360 is on and passes first voltage supply 260 to voltage supply 115.

Figure 5:
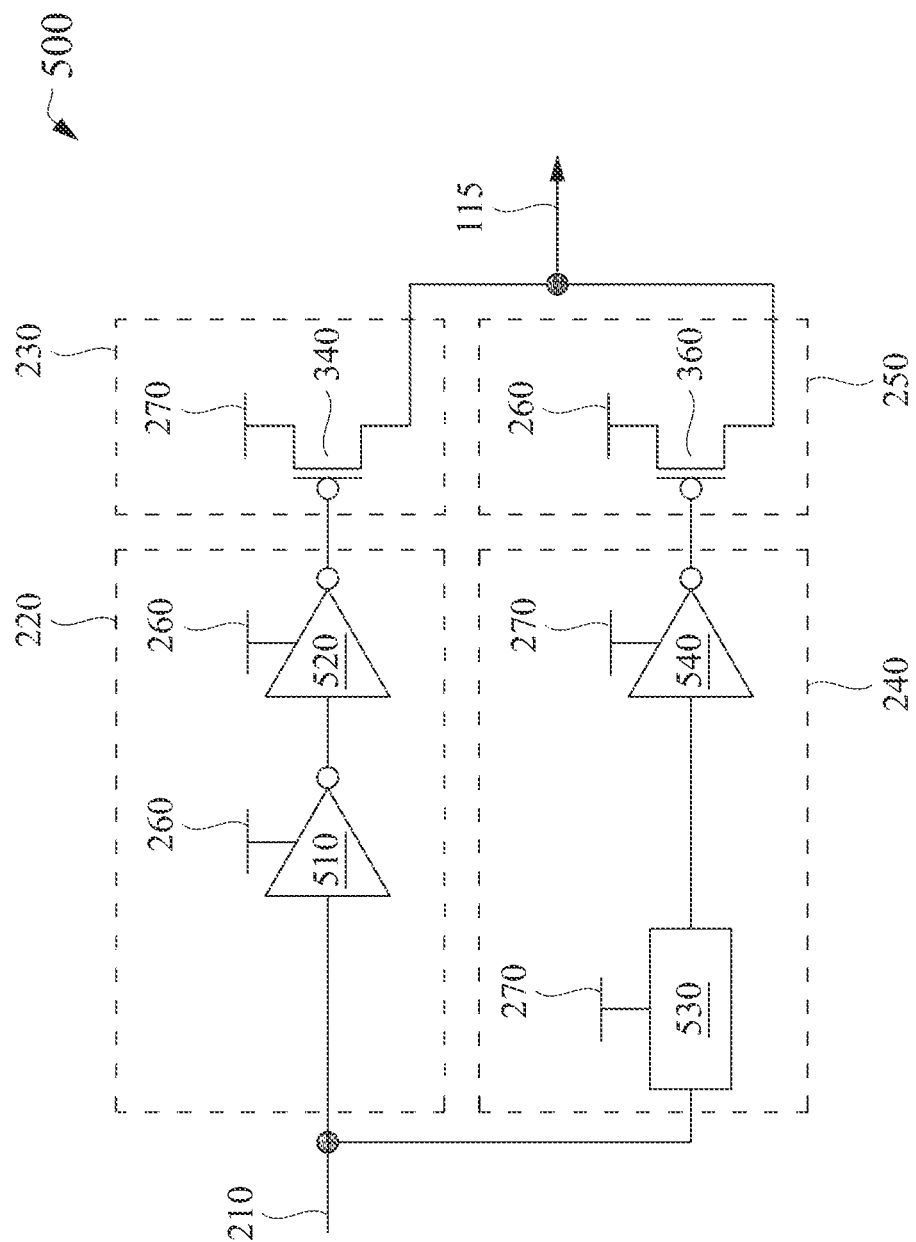
FIG. 5 is an illustration of a second circuit-level representation of a voltage supply selection circuit, according to some embodiments of the present disclosure.

FIG. 5 is an illustration of a second circuit-level representation of a voltage supply selection circuit 500, according to some embodiments of the present disclosure. Voltage supply selection circuit 500 can represent voltage supply selection circuit 110 of FIGS. 1 and 2. In this example, selection signal 210 is in the voltage domain of first voltage supply 260 (e.g., $V_{DDM}$ voltage domain). For example, when selection signal 210 is at a logic high, selection signal 210 is at the voltage level of first voltage supply 260 (e.g., $V_{DDM}$ voltage level). And, when selection signal 210 is at a logic low, selection signal 210 is at ground (e.g., 0 V).

First control switch 220 includes a first inverter circuit 510 and a second inverter circuit 520, in which power supplies of these circuits are electrically coupled to first voltage supply 260. First inverter circuit 510 receives (or is electrically coupled to) and inverts selection signal 210 as an output. Second inverter circuit 520 receives (or is electrically coupled to) and inverts an output of first inverter circuit 510. First voltage supply switch 230 in voltage supply selection circuit 500 has the same circuit-level representation as first voltage supply switch 230 in voltage supply selection circuit 300 of FIG. 3.

Second control switch 240 includes a level-shifter circuit 530 and a third inverter circuit 540, in which power supplies of these circuits are electrically coupled to second voltage supply 270. Level-shifter circuit 530 receives (or is electrically coupled to) selection signal 210. In some embodiments, level-shifter circuit 530 sets a voltage level of selection signal 210 to the same voltage domain as second voltage supply 270 (e.g., $V_{DD}$ voltage domain) at its output. For example, if selection signal 210 is at a logic high (e.g., $V_{DDM}$ voltage level), level-shifter circuit 530 outputs a logic high in the voltage domain of second voltage supply 270 (e.g., $V_{DD}$ voltage Level). Conversely, if selection signal 210 is at a logic low (e.g., 0 V), level-shifter circuit 530 outputs ground (e.g., 0 V). Third inverter circuit 540 receives (or is electrically coupled to) and inverts the output of level-shifter circuit 530. Second voltage supply switch 250 in voltage supply selection circuit 500 has the same circuit-level representation as second voltage supply switch 250 in voltage supply selection circuit 300 of FIG. 3.

Figure 6:
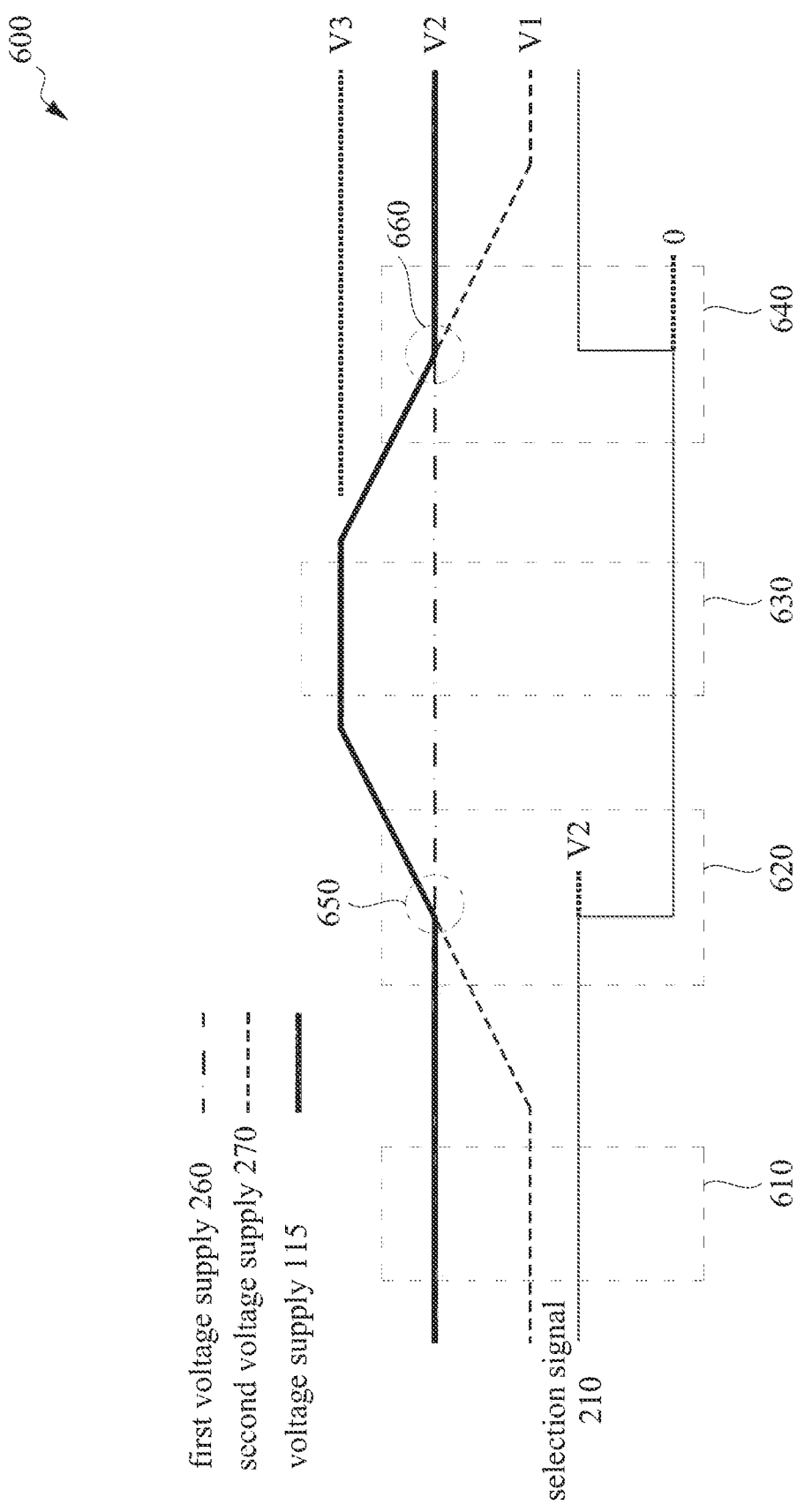
FIG. 6 is an illustration of example waveforms for a second circuit-level representation of a voltage supply selection circuit, according to some embodiments of the present disclosure.

FIG. 6 is an illustration of example waveforms 600 for voltage supply selection circuit 500, according to some embodiments of the present disclosure. As discussed above, for voltage supply selection circuit 500, selection signal 210 is in the voltage domain of first voltage supply 260 (e.g., $V_{DDM}$ voltage domain). In waveforms 600, voltage V1 represents a voltage level of second voltage supply 270 when system 100 of FIG. 1 is in a normal mode of operation (e.g., when system 100 is not in a high performance mode of operation), voltage V2 represents a voltage level of first voltage supply 260, and voltage V3 represents a voltage level of second voltage supply 270 when system 100 is in the high performance mode of operation (e.g., to support a higher frequency to execute circuit operations faster). Voltage V3 can be at a voltage level higher than that of voltage V2, which can be at a voltage level higher than that of voltage V1. In some embodiments, the voltage level of first voltage supply 260 is substantially the same during the normal and high performance modes of operation for system 100.

During a time window 610, selection signal 210 is at a logic high (e.g., voltage V2) and system 100 is in a normal mode of operation. Under these conditions, voltage supply 115 is electrically coupled to first voltage supply 260. Referring to FIG. 5, with selection signal 210 at a logic high (e.g., voltage V2), second control switch 240 outputs a logic low (e.g., 0 V). Specifically, level-shifter circuit 530 receives a logic high from selection signal 210 (which is in the voltage domain of first voltage supply 260) and outputs a logic high in the voltage domain of second voltage supply 270. In turn, third inverter circuit 540 receives the logic high output from level-shifter 530 and outputs a logic low (e.g., 0 V). Second voltage supply switch 250 receives the logic low output from second control switch 240 and passes first voltage supply 260 to voltage supply 115. Specifically, p-type transistor 360 receives the logic low (e.g., 0 V) output from third inverter circuit 540 at its gate terminal. As a result, p-type transistor 360 is on and passes first voltage supply 260 (e.g., voltage V2) to voltage supply 115.

Further, with selection signal 210 at a logic high (e.g., voltage V2), first control switch 220 outputs a logic high (e.g., first voltage supply 260). Specifically, first inverter circuit 510 receives a logic high from selection signal 210 and outputs a logic low. In turn, second inverter circuit 520 receives the logic low output from first inverter circuit 510 and outputs a logic high (e.g., first voltage supply 260). First voltage supply switch 230 receives the logic high output from first control switch 220, which prevents second voltage supply 270 from being passed to voltage supply 115. Specifically, p-type transistor 340 receives the logic high (e.g., voltage V2) output from second inverter circuit 520 at its gate terminal. Because the first S/D terminal receives second voltage supply 270, which is lower than voltage V2 at the gate of p-type transistor 340, p-type transistor 340 is off and does not pass second voltage supply 270 to voltage supply 115.

During a time window 620, selection signal 210 transitions from a logic high to a logic low and second voltage supply 270 transitions from voltage V1 to voltage V3 in preparation for a high performance mode of operation for system 100. Because selection signal 210 is in the voltage domain of first voltage supply 260 (e.g., $V_{DDM}$ voltage domain), as second voltage supply 270 transitions from voltage V1 to voltage V3, selection signal 210 maintains its voltage level (which is unlike when selection signal 210 is in the voltage domain of second voltage supply 270, as shown in time window 420 of FIG. 4). In some embodiments, selection signal 210 transitions from a logic high (e.g., voltage V2) to a logic low (e.g., 0 V) at a tune 650, which is a time when first voltage supply 260 and second voltage supply 270 are substantially at the same voltage level.

Referring to FIG. 5, with selection signal 210 at a logic low (e.g., 0 V), first control switch 220 outputs a logic low (e.g., 0 V). Specifically, first inverter circuit 510 receives a logic low from selection signal 210 and outputs a logic high (e.g., first voltage supply 260). In turn, second inverter circuit 520 receives the logic high output from inverter circuit 510 and outputs a logic low (e.g., 0 V). First voltage supply switch 230 receives the logic low output from first control switch 220 and passes second voltage supply 270 to voltage supply 115. Specifically, p-type transistor 340 receives the logic low (e.g., 0 V) output from second inverter circuit 520 at its gate terminal. As a result, p-type transistor 340 is on and passes second voltage supply 270 (e.g., transitioning from voltage V1 to voltage V3) to voltage supply 115.

Further, with selection signal 210 at a logic low (e.g., 0 V), second control switch 240 outputs a logic high (e.g., second voltage supply 270). Specifically, level-shifter circuit 530 receives selection signal 210 and outputs a logic low (e.g., 0 V). Third inverter circuit 540 receives the logic low output from level-shifter circuit 530 and outputs a logic high (e.g., second voltage supply 270). Second voltage supply switch 250 receives the logic high output from second control switch 240, which prevents first voltage supply 260 from being passed to voltage supply 115. Specifically, p-type transistor 360 receives the logic high (e.g., second voltage supply 270) output from third inverter circuit 540 at its gate terminal. At time 650 of FIG. 6, first voltage supply 260 and second voltage supply 270 are at or at substantially the same voltage level. As a result, p-type transistor 360 is off and does not pass first voltage supply 260 to voltage supply 115.

During a time window 630, selection signal 210 is at a logic low and second voltage supply 270 is at voltage V3. Because second voltage supply 270 is passed to voltage supply 115 via first voltage supply switch 230, voltage supply 115 is at voltage V3. As a result, circuit 120 of FIG. 1 receives a higher voltage supply to facilitate a high performance mode of operation, where it can operate at a higher frequency to execute circuit operations faster.

During a time window 640, selection signal 210 transitions from a logic low to a logic high and second voltage supply 270 transitions from voltage V3 to voltage V1 in preparation for a normal mode of operation for system 100. Because selection signal 210 is in the voltage domain of first voltage supply 260 (e.g., $V_{DDM}$ voltage domain), as second voltage supply 270 transitions from voltage V3 to voltage V1, selection signal 210 maintains its voltage level (which is unlike when selection signal 210 is in the voltage domain of second voltage supply 270, as shown in time window 440 of FIG. 4). In some embodiments, selection signal 210 transitions from a logic low to a logic high at a time 660, which is a time when first voltage supply 260 and second voltage supply 270 are substantially at the same voltage level.

Referring to FIG. 5, with selection signal 210 at a logic high, first control switch 220 outputs a logic high (e.g., first voltage supply 260). Specifically, first inverter circuit 510 receives a logic high from selection signal 210 and outputs a logic low (e.g., 0 V). In turn, second inverter circuit 520 receives the logic low output from first inverter circuit 510 and outputs a logic high (e.g., first voltage supply 260). First voltage supply switch 230 receives the logic high output from first control switch 220, which prevents second voltage supply 270 from being passed to voltage supply 115. Specifically, p-type transistor 340 receives the logic high (e.g., first voltage supply 260) output from second inverter circuit 520 at its gate terminal. At time 660 of FIG. 6, first voltage supply 260 and second voltage supply 270 are at the same or substantially the same voltage level. As a result, p-type transistor 340 is off and prevents second voltage supply 270 (e.g., transitioning from voltage V3 to voltage V1) from being passed to voltage supply 115.

Further, with selection signal 210 at a logic high, second control switch 240 outputs a logic low (e.g., 0 V). Specifically, level-shifter circuit 530 receives a logic high from selection signal 210 (which is in the voltage domain of first voltage supply 260) and outputs a logic high in the voltage domain of second voltage supply 270. In turn, third inverter circuit 540 receives the logic high output from level-shifter circuit 530 and outputs a logic low (e.g., 0 V). Second voltage supply switch 250 receives the logic low output from second control switch 240 and passes first voltage supply 260 to voltage supply 115. Specifically, p-type transistor 360 receives the logic low (e.g., 0 V) output from third inverter circuit 540 at its gate terminal. As a result, p-type transistor 360 is on and passes first voltage supply 260 (e.g., voltage V2) to voltage supply 115.

Figure 7:
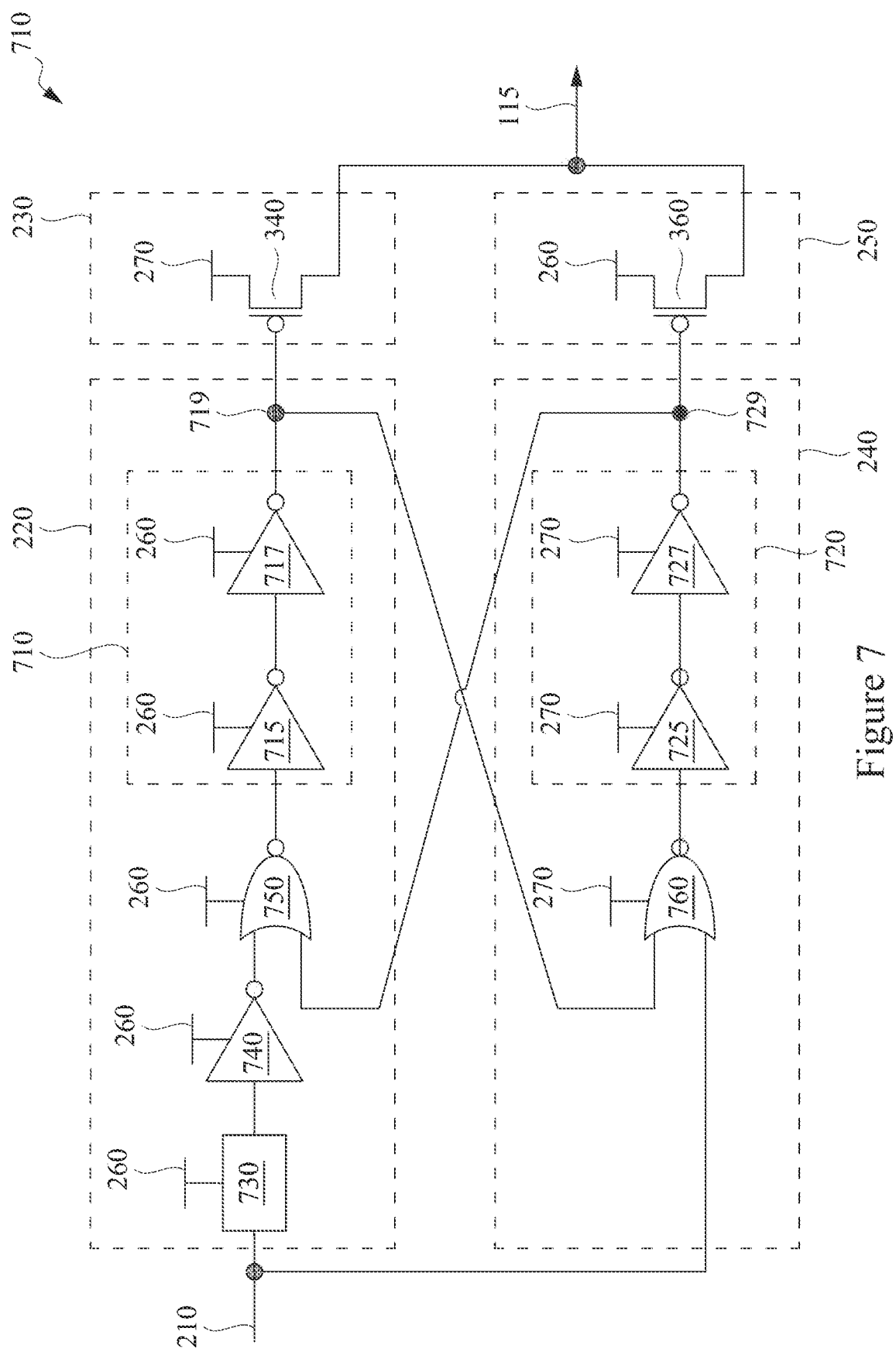
FIG. 7 is an illustration of a third circuit-level representation of a voltage supply selection circuit, according to some embodiments of the present disclosure.

FIG. 7 is an illustration of a third circuit-level representation of a voltage supply selection circuit 700, according to some embodiments of the present disclosure. Voltage supply selection circuit 700 can represent voltage supply selection circuit 110 of FIGS. 1 and 2. In this example, selection signal 210 is in the voltage domain of second voltage supply 270 (e.g., $V_{DD}$ voltage domain). For example, when selection signal 210 is at a logic high, selection signal 210 is at the voltage level of second voltage supply 270 (e.g., $V_{DD}$ voltage level). And, when selection signal 210 is at a logic low, selection signal 210 is at ground (e.g., 0 V).

First control switch 220 includes a level-shifter circuit 730, a first inverter circuit 740, a first NOR circuit 750, and a first delay circuit 710. Level-shifter circuit 730 receives (or is electrically coupled to) selection signal 210. In some embodiments, level-shifter circuit 730 sets a voltage level of selection signal 210 to be in the same voltage domain as first voltage supply 260 (e.g., $V_{DDM}$ voltage domain) at its output. For example, if selection signal 210 is at a logic high (e.g., $V_{DD}$ voltage level), level-shifter circuit 730 outputs a logic high in the voltage domain of first voltage supply 260 (e.g., $V_{DDM}$ voltage level). Conversely, if selection signal 210 is at a logic low (e.g., 0 V), level-shifter circuit 730 outputs ground (e.g., 0 V). First inverter circuit 740 receives (or is electrically coupled to) and inverts the output of level-shifter circuit 730. First NOR circuit 750 receives (or is electrically coupled to) an output of first inverter circuit 740 at a first input and receives (or is electrically coupled to) an output of second control switch 240 (e.g., node 729) at a second input. First delay circuit 710 receives (or is electrically coupled to) an output of first NOR circuit 750. First delay circuit 710 includes a second inverter circuit 715 and a third inverter circuit 717. Second inverter circuit 715 receives (or is electrically coupled to) and inverts the output of first NOR circuit 750. Third inverter circuit 717 receives (or is electrically coupled to) and inverts an output of second inverter circuit 715. First voltage supply switch 230 in voltage supply selection circuit 700 has the same circuit-level representation as first voltage supply switch 230 in voltage supply selection circuit 300 of FIG. 3.

Second control switch 240 includes a second NOR circuit 760 and a second delay circuit 720. Second NOR circuit 760 receives (or is electrically coupled to) selection signal 210 at a first input and receives (or is electrically coupled to) an output of first control switch 220 (e.g., node 719) at a second input. Second delay circuit 720 receives (or is electrically coupled to) an output of second NOR circuit 760. Second delay circuit 720 includes a fourth inverter circuit 725 and a fifth inverter circuit 727. Fourth inverter circuit 725 receives (or is electrically coupled to) and inverts the output of second NOR circuit 760. Fifth inverter circuit 727 receives (or is electrically coupled to) and inverts an output of fourth inverter circuit 725. Second voltage supply switch 250 in voltage supply selection circuit 700 has the same circuit-level representation as second voltage supply switch 250 in voltage supply selection circuit 300 of FIG. 3.

Figure 8:
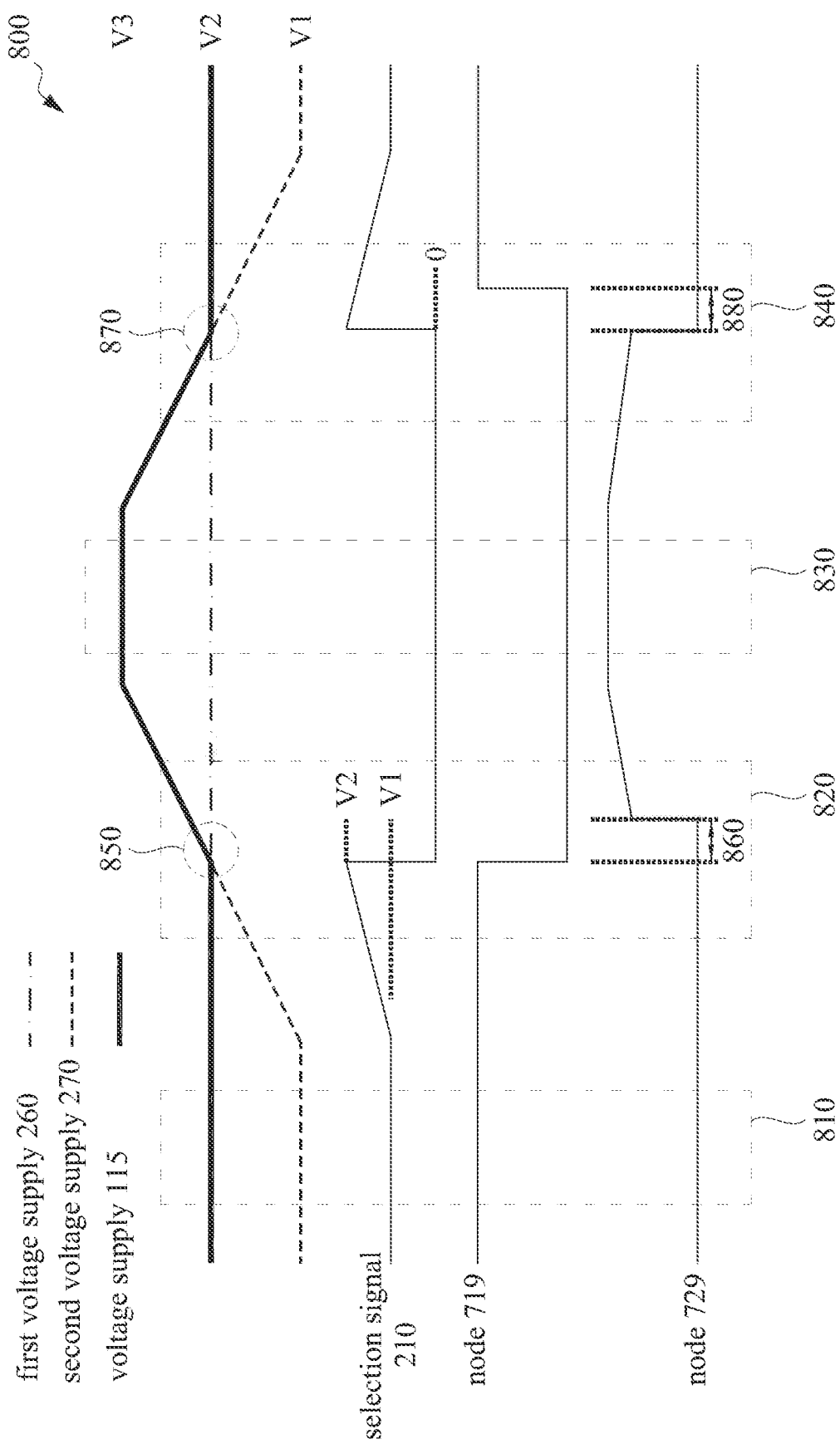
FIG. 8 is an illustration of example waveforms for a third circuit-level representation of a voltage supply selection circuit, according to some embodiments of the present disclosure.

FIG. 8 is an illustration of example waveforms 800 for voltage supply selection circuit 700, according to some embodiments of the present disclosure. As discussed above, for voltage supply selection circuit 700, selection signal 210 is in the voltage domain of second voltage supply 270 (e.g., $V_{DD}$ voltage domain). In waveforms 800, voltage V1 represents a voltage level of second voltage supply 270 when system 100 of FIG. 1 is in a normal mode of operation (e.g., when system 100 is not in a high performance mode of operation), voltage V2 represents a voltage level of first voltage supply 260, and voltage V3 represents a voltage level of second voltage supply 270 when system 100 is in the high performance mode of operation (e.g., to support a higher frequency to execute circuit operations faster). Voltage V3 can be at a voltage level higher than that of voltage V2, which can be at a voltage level higher than that of voltage V1. In some embodiments, the voltage level of first voltage supply 260 is substantially the same during the normal and high performance modes of operation for system 100.

During a time window 810, selection signal 210 is at a logic high (e.g., voltage V1) and system 100 is in a normal mode of operation. Under these conditions, voltage supply 115 is electrically coupled to first voltage supply 260. Referring to FIG. 7, with selection signal 210 at a logic high (e.g., voltage V1), second control switch 240 outputs a logic low (e.g., 0 V). Specifically, second NOR circuit 760 receives selection signal 210 at a first input and outputs a logic low (e.g., 0 V). Second delay circuit 720 receives the logic low output from second control switch 240 and outputs a logic low to second voltage supply switch 250. Specifically, fourth inverter circuit 725 receives the logic low output from second NOR circuit 760 and outputs a logic high (e.g., second voltage supply 270). Fifth inverter circuit 727 receives the logic high output from fourth inverter circuit 725 and outputs a logic low (e.g., 0 V). Second voltage supply switch 250 receives the logic low output from second control switch 240 and passes first voltage supply 260 to voltage supply 115. Specifically, p-type transistor 360 receives the logic low (e.g., 0 V) output from fifth inverter circuit 727 at its gate terminal. As a result, p-type, transistor 360 is on and passes first voltage supply 260 (e.g., voltage V2) to voltage supply 115.

Further, with selection signal 210 at a logic high (e.g., voltage V1), first control switch 220 outputs a logic high (e.g., first voltage supply 260). Specifically, level-shifter circuit 730 receives a logic high from selection signal 210 (which is in the voltage domain of second voltage supply 270) and outputs a logic high in the voltage domain of first voltage supply 260. In turn, first inverter circuit 740 receives the logic high output from level-shifter circuit 730 and outputs a logic low (e.g., 0 V). First NOR circuit 750 receives the logic low output from first inverter circuit 740 at a first input and the logic low output from second control switch 240 at a second input—in which first NOR circuit 750 outputs a logic high (e.g., first voltage supply 260). First delay circuit 710 receives the logic high output from first NOR circuit 750 and outputs a logic high (e.g., first voltage supply 260). Specifically, second inverter circuit 715 receives the logic high output from first NOR circuit 750 and outputs a logic low (e.g., 0 V). Third inverter circuit 717 receives the logic low output from second inverter circuit 715 and outputs a logic high (e.g., voltage V2).

First voltage supply switch 230 receives the logic high output from first control switch 220, which prevents second voltage supply 270 from being passed to voltage supply 115. Specifically, p-type transistor 340 receives the logic high (e.g., voltage V2) output from third inverter circuit 717 at its gate terminal. Because the first S/D terminal receives second voltage supply 270, which is lower than voltage V2 at the gate of p-type transistor 340, p-type transistor 340 is off and does not pass second voltage supply 270 to voltage supply 115.

During a time window 820, selection signal 210 transitions from a logic high to a logic low and second voltage supply 270 transitions from voltage V1 to voltage V3 in preparation for a high performance mode of operation for system 100. Because selection signal 210 is in the voltage domain of second voltage supply 270 (e.g., $V_{DD}$ voltage domain), as second voltage supply 270 transitions from voltage V1 to voltage V3, selection signal 210 transitions in a similar manner while selection signal 210 is at a logic high. In some embodiments, selection signal 210 transitions from a logic high (e.g., voltage V2) to a logic low (e.g., 0 V) at a time 850, which is a time when first voltage supply 260 and second voltage supply 270 are substantially at the same voltage level.

Referring to FIG. 7, with selection signal 210 at a logic low (e.g., 0 V), first control switch 220 outputs a logic low (e.g., 0 V). Specifically, level-shifter circuit 730 receives a logic low from selection signal 210 and outputs a logic low (e.g., 0 V). In turn, first inverter circuit 740 receives the logic low output from level-shifter circuit 730 and outputs a logic high (e.g., first voltage supply 260). First NOR circuit 750 receives the logic high output from first inverter circuit 740 and outputs a logic low (e.g., 0 V). First delay circuit 710 receives the logic low output from first NOR circuit 750 and outputs a logic low. Specifically, second inverter circuit 715 receives the logic low output from first NOR circuit 750 and outputs a logic high (e.g., first voltage supply 260). Third inverter circuit 717 receives the logic high output from second inverter circuit 715 and outputs a logic low (e.g., 0 V).

First voltage supply switch 230 receives the logic low output from first control switch 220 and passes second voltage supply 270 to voltage supply 115. Specifically, p-type transistor 340 receives the logic low (e.g., 0 V) output from third inverter circuit 717 at its gate terminal. As a result, p-type transistor 340 is on and passes second voltage supply 270 (e.g., transitioning from voltage V1 to voltage V3) to voltage supply 115.

Further, with selection signal 210 at a logic low (e.g., 0 V), second control switch 240 outputs a logic high (e.g., second voltage supply 270). Specifically, second NOR circuit 760 receives selection signal 210 at a first input and the output of first control switch 220 (e.g., node 719) at a second input. Because selection signal 210 and the output of first control switch 220 are both at a logic low (e.g., 0 V), an output of second NOR circuit 760 is at a logic high (e.g., second voltage supply 270). Second delay circuit 720 receives the logic high output from second NOR circuit 760 and outputs a delayed version of the logic high. Specifically, fourth inverter circuit 725 receives the logic high output from second NOR circuit 760 and outputs a logic low. Fifth inverter circuit 727 receives the logic low output from fourth inverter circuit 725 and outputs a logic high (e.g., second voltage supply 270)—thus outputting a delayed version of the logic high output from second NOR circuit 760. An example of a time delay representative of the delayed version of the logic high output from second NOR circuit 760 is shown as a delay 860 in FIG. 8, which shows a delay between the output of first control switch 220 (e.g., node 719) transitioning from a logic high to a logic low and the output of second control switch 240 (e.g., node 729) transitioning from a logic low to a logic high. During delay 860, because the outputs of first control switch 220 (e.g., node 719) and second control switch 240 (e.g., node 729) are at a logic low, p-type transistors 340 and 360 (in first and second voltage supply switches 230 and 250, respectively) are on at the same time—thus preventing voltage supply 115 from floating during the transition of selection signal 210.

Referring to FIG. 7, after delay 860, second voltage supply switch 250 receives the logic high output from second control switch 240, which prevents first voltage supply 260 from being passed to voltage supply 115 after delay 860. Specifically, after delay 860, p-type transistor 360 receives the logic high (e.g., second voltage supply 270) output from fifth inverter circuit 727 at its gate terminal. After time 850 of FIG. 8 (e.g., time 850 plus delay 860), second voltage supply 270 is at a higher voltage level than first voltage supply 260. As a result, p-type transistor 360 is off and does not pass first voltage supply 260 to voltage supply 115.

During a time window 830, selection signal 210 is at a logic low and second voltage supply 270 is at voltage V3. Because second voltage supply 270 is passed to voltage supply 115 via first voltage supply switch 230, voltage supply 115 is at voltage V3. As a result, circuit 120 of FIG. 1 receives a higher voltage supply to facilitate a high performance mode of operation, where it can operate at a higher frequency to execute circuit operations faster.

During a time window 840, selection signal 210 transitions from a logic low to a logic high and second voltage supply 270 transitions from voltage V3 to voltage V1 in preparation for a normal mode of operation for system 100. In some embodiments, selection signal 210 transitions from a logic low to a logic high at a time 870, which is a time when first voltage supply 260 and second voltage supply 270 are substantially at the same voltage level. Because selection signal 210 is in the voltage domain of second voltage supply 270 (e.g., $V_{DD}$ voltage domain), as second voltage supply 270 transitions from voltage V3 to voltage V1, selection signal 210 transitions in a similar manner while selection signal 210 is at a logic high.

Referring to FIG. 7, with selection signal 210 at a logic high, first control switch 220 outputs a logic high (e.g., first voltage supply 260). Specifically, level-shifter circuit 730 receives a logic high from selection signal 210 and outputs a logic high (e.g., first voltage supply 260). In turn, first inverter circuit 740 receives the logic high output from level-shifter circuit 730 and outputs a logic low (e.g., 0 V). First NOR circuit 750 receives the logic low output from first inverter circuit 740 at a first input and the output of second control switch 240 (e.g., node 729) at a second output. Because the output of first inverter circuit 740 and the output of second control switch 240 are both at a logic low (e.g., 0 V), first NOR circuit 750 outputs a logic high (e.g., first voltage supply 260). First delay circuit 710 receives the logic high output from first NOR circuit 750 and outputs a delayed version of the logic high. Specifically, second inverter circuit 715 receives the logic high output from first NOR circuit 750 and outputs a logic low. Third inverter circuit 717 receives the logic low output from second inverter circuit 715 and outputs a logic high (e.g., first voltage supply 260)—thus outputting a delayed version of the logic high output from first NOR circuit 750. An example of a time delay representative of the delayed version of the logic high output from first NOR circuit 750 is shown as a delay 880 in FIG. 8, which shows a delay between the output of second control switch 240 (e.g., node 729) transitioning from a logic high to a logic low and the output of first control switch 220 (e.g., node 719) transitioning from a logic low to a logic high. During delay 880, because the outputs of first control switch 220 (e.g., node 719) and second control switch 240 (e.g., node 729) are at a logic low, p-type transistors 340 and 360 (in first and second voltage supply switches 230 and 250, respectively) are on at the same time—thus preventing voltage supply 115 from floating during the transition of selection signal 210.

Referring to FIG. 7, after delay 880, first voltage supply switch 230 receives the logic high output from first control switch 220, which prevents second voltage supply 270 from being passed to voltage supply 115. Specifically, after delay 880, p-type transistor 340 receives the logic high (e.g., first voltage supply 260) output from third inverter circuit 717 at its gate terminal. After time 870 of FIG. 8 (e.g., time 870 plus delay 880), first voltage supply 260 is at a higher voltage level than second voltage supply 270. As a result, p-type transistor 340 is off and does not pass second voltage supply 270 to voltage supply 115.

Further, with selection signal 210 at a logic high, second control switch 240 outputs a logic low (e.g., 0 V). Specifically, second NOR circuit 760 receives selection signal 210 at a first input and the output of first control switch 220 (e.g., node 719) at a second input. Because selection signal 210 and the output of first control switch 220 are both at a logic high (e.g., second voltage supply 270), an output of second NOR circuit 760 is at a logic low (e.g., 0 V). Second delay circuit 720 receives the logic low output from second NOR circuit 760 and outputs a logic low. Specifically, fourth inverter circuit 725 receives the logic low output from second NOR circuit 760 and outputs a logic high (e.g., second voltage supply 270). Fifth inverter circuit 727 receives the logic high output from fourth inverter circuit 725 and outputs a logic low (e.g., 0 V).

After delay 880, second voltage supply switch 250 receives the logic low output from second control switch 240 and passes first voltage supply 260 to voltage supply 115. Specifically, after delay 880, p-type transistor 360 receives the logic low (e.g., 0 V) output from fifth inverter circuit 727 at its gate terminal. As a result, p-type transistor 360 is on and passes first voltage supply 260 to voltage supply 115.

Figure 9:
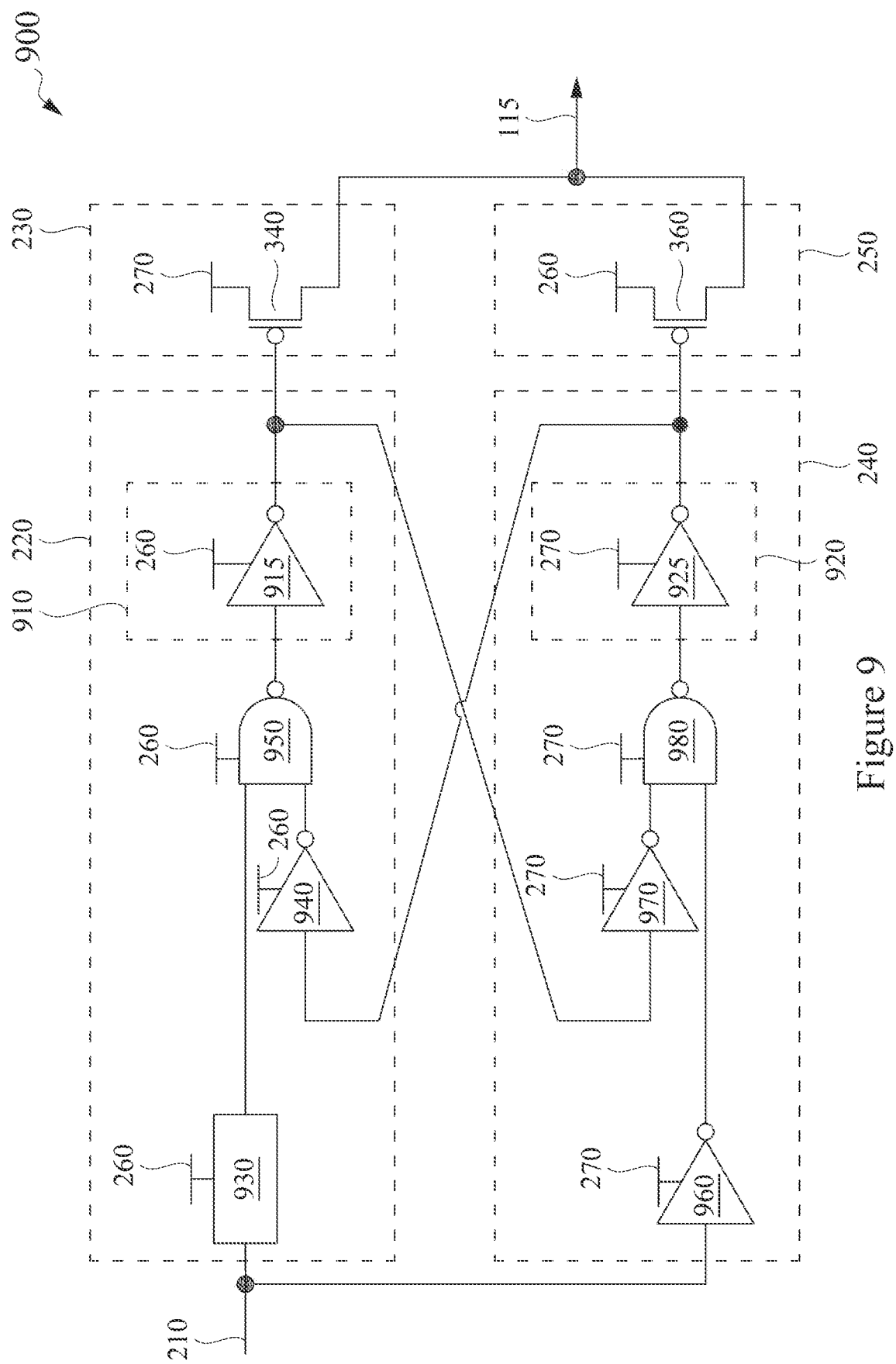
FIG. 9 is an illustration of a fourth circuit-level representation of a voltage supply selection circuit, according to some embodiments of the present disclosure.

FIG. 9 is an illustration of a fourth circuit-level representation of a voltage supply selection circuit 900, according to some embodiments of the present disclosure. Voltage supply selection circuit 900 can represent voltage supply selection circuit 110 of FIGS. 1 and 2. In this example, selection signal 210 is in the voltage domain of second voltage supply 270 (e.g., $V_{DD}$ voltage domain). For example, when selection signal 210 is at a logic high, selection signal 210 is at the voltage level of second voltage supply 270 (e.g., $V_{DD}$ voltage level). And, when selection signal 210 is at a logic low, selection signal 210 is at ground (e.g., 0 V).

First control switch 220 includes a level-shifter circuit 930, a first inverter circuit 940, a first NAND circuit 950, and a first delay circuit 910. Level-shifter circuit 930 receives (or is electrically coupled to) selection signal 210. In some embodiments, level-shifter circuit 930 sets a voltage level of selection signal 210 to be in the same voltage domain as first voltage supply 260 (e.g., $V_{DDM}$ voltage domain) at its output. For example, if selection signal 210 is at a logic high (e.g., $V_{DD}$ voltage level), level-shifter circuit 930 outputs a logic high in the voltage domain of first voltage supply 260 (e.g., $V_{DDM}$ voltage level). Conversely, if selection signal 210 is at a logic low (e.g., 0 V), level-shifter circuit 930 outputs ground (e.g., 0 V). First inverter circuit 940 receives (or is electrically coupled to) and inverts an output of second control switch 240. First NAND circuit 950 receives (or is electrically coupled to) the output of level-shifter circuit 930 at a first input and receives (or is electrically coupled to) the output of first inverter circuit 940 at a second input. First delay circuit 910 receives (or is electrically coupled to) an output of first NAND circuit 950. First delay circuit 910 includes a second inverter circuit 915, which receives (or is electrically coupled to) and inverts an output of first NAND circuit 950. First voltage supply switch 230 in voltage supply selection circuit 900 has the same circuit-level representation as first voltage supply switch 230 in voltage supply selection circuit 300 of FIG. 3.

Second control switch 240 includes a fourth inverter circuit 960, a fifth inverter circuit 970, a second NAND circuit 980, and a second delay circuit 920. Fourth inverter circuit 960 receives is electrically coupled to) and inverts selection signal 210. Fifth inverter circuit 970 receives (or is electrically coupled to) and inverts an output of first control switch 220. Second NAND circuit 980 receives (or is electrically coupled to) an output of fourth inverter circuit 960 at a first input and receives (or is electrically coupled to) an output of fifth inverter circuit 970 at a second input. Second delay circuit 920 receives (or is electrically coupled to) an output of second NAND circuit 980. Second delay circuit 920 includes sixth inverter circuit 925, which receives (or is electrically coupled to) and inverts an output of second NAND circuit 980. Second voltage supply switch 250 in voltage supply selection circuit 900 has the same circuit-level representation as second voltage supply switch 250 in voltage supply selection circuit 300 of FIG. 3.

Voltage supply selection circuit 900 of FIG. 9 operates in a similar manner as that of voltage supply selection circuit 700 of FIG. 7. For example, referring to waveforms 800 of FIG. 8, delays 860 and 880 occur as a result of the delays caused by delay circuits 910 and 920 of FIG. 9, During delays 860 and 880, first and second voltage supply switches 230 and 250 are on at the same time—thus preventing voltage supply 115 from floating during the transition of selection signal 210. After delay 860, second voltage supply switch 250 is off. And, after delay 880, first voltage supply switch 230 is off.

Figure 10:
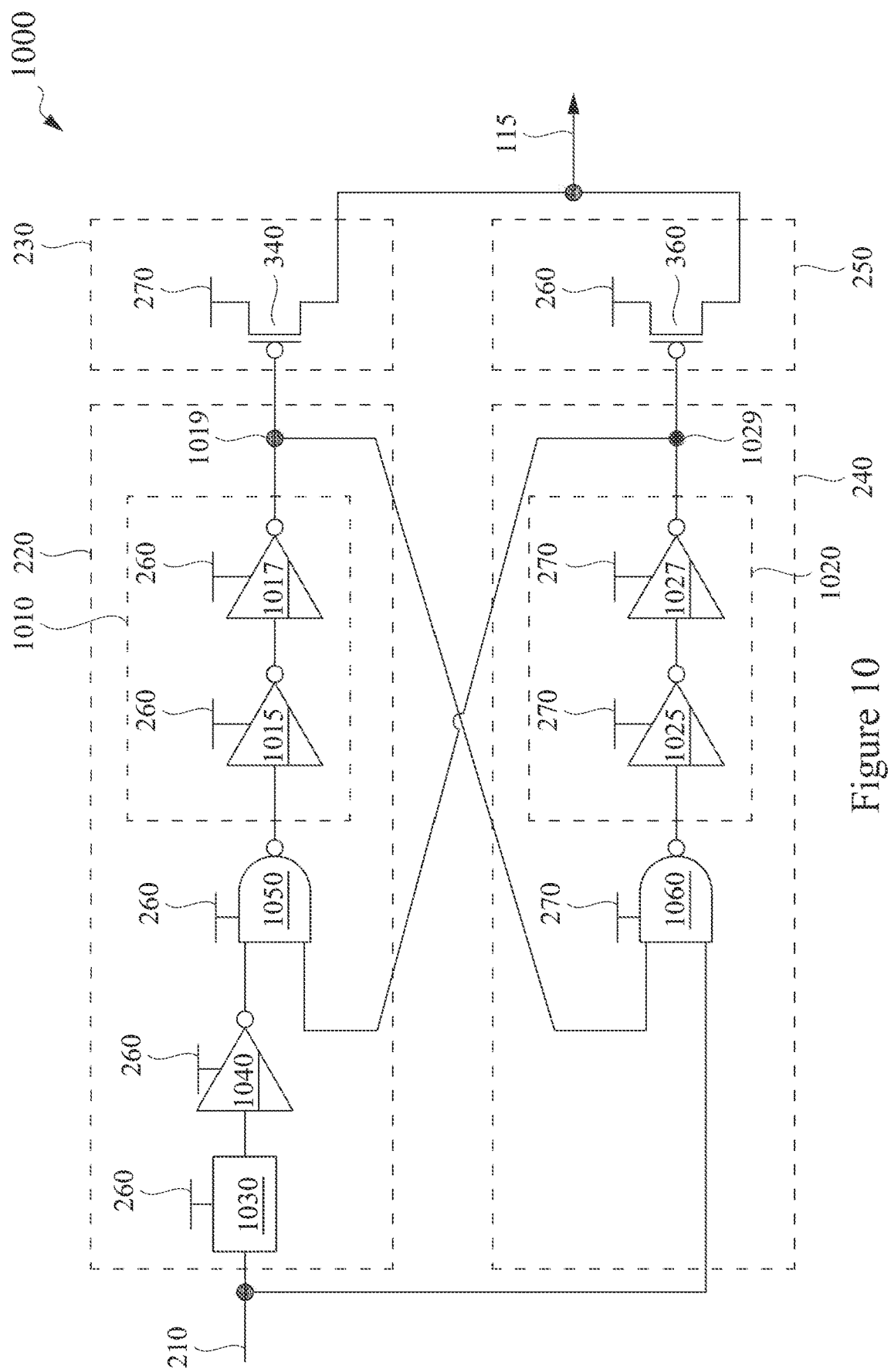
FIG. 10 is an illustration of a fifth circuit-level representation of a voltage supply selection circuit, according to some embodiments of the present disclosure.

FIG. 10 is an illustration of a fifth circuit-level representation of a voltage supply selection circuit 1000, according to some embodiments of the present disclosure. Voltage supply selection circuit 1000 can represent voltage supply selection circuit 110 of FIGS. 1 and 2. In this example, selection signal 210 is in the voltage domain of second voltage supply 270 (e.g., $V_{DD}$ voltage domain). For example, when selection signal 210 is at a logic high, selection signal 210 is at the voltage level of second voltage supply 270 (e.g., $V_{DD}$ voltage level). And, when selection signal 210 is at a logic low, selection signal 210 is at ground (e.g., 0 V).

First control switch 220 includes a level-shifter circuit 1030, a first inverter circuit 1040, a first NAND circuit 1050, and a first delay circuit 1010. Level-shifter circuit 1030 receives (or is electrically coupled to) selection signal 210. In some embodiments, level-shifter circuit 1030 sets a voltage level of selection signal 210 to be in the same voltage domain as first voltage supply 260 (e.g., $V_{DDM}$ voltage domain) at its output. For example, if selection signal 210 is at a logic high (e.g., $V_{DD}$ voltage level), level-shifter circuit 1030 outputs a logic high in the voltage domain of first voltage supply 260 (e.g., $V_{DDM}$ voltage level). Conversely, if selection signal 210 is at a logic low (e.g., 0 V), level-shifter circuit 1030 outputs ground (e.g., 0 V). First inverter circuit 1040 receives (or is electrically coupled to) and inverts the output of level-shifter circuit 1030. First NAND circuit 1050 receives (or is electrically coupled to) an output of first inverter circuit 1040 at a first input and receives (or is electrically coupled to) an output of second control switch 240 (e.g., node 1029) at a second input. First delay circuit 1010 receives (or is electrically coupled to) an output of first NAND circuit 1050. First delay circuit 1010 includes a second inverter circuit 1015 and a third inverter circuit 1017. Second inverter circuit 1015 receives (or is electrically coupled to) and inverts the output of first NAND circuit 1050. Third inverter circuit 1017 receives (or is electrically coupled to) and inverts an output of second inverter circuit 1015. First voltage supply switch 230 in voltage supply selection circuit 1000 has the same circuit-level representation as first voltage supply switch 230 in voltage supply selection circuit 300 of FIG. 3.

Second control switch 240 includes a second NAND circuit 1060 and a second delay circuit 1020. Second NAND circuit 1060 receives (or is electrically coupled to) selection signal 210 at a first input and receives (or is electrically coupled to) an output of first control switch 220 (e.g., node 1019) at a second input. Second delay circuit 1020 receives (or is electrically coupled to) an output of second NAND circuit 1060. Second delay circuit 1020 includes a fourth inverter circuit 1025 and a fifth inverter circuit 1027. Fourth inverter circuit 1025 receives (or is electrically coupled to) and inverts the output of second NAND circuit 1060. Fifth inverter circuit 1027 receives (or is electrically coupled to) and inverts an output of fourth inverter circuit 1025. Second voltage supply switch 250 in voltage supply selection circuit 1000 has the same circuit-level representation as second voltage supply switch 250 in voltage supply selection circuit 300 of FIG. 3.

Figure 11:
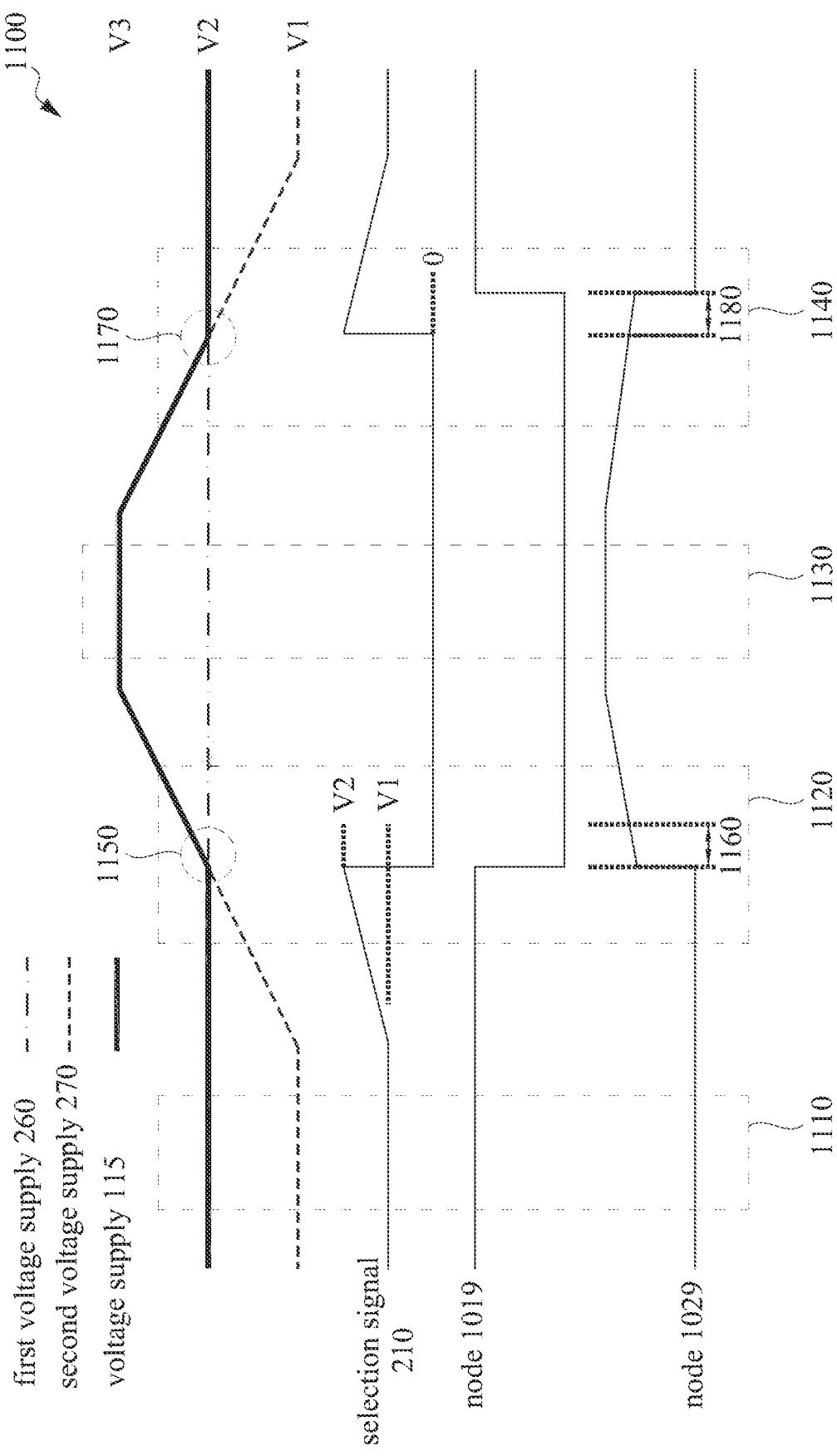
FIG. 11 is an illustration of example waveforms for a fifth circuit-level representation of a voltage supply selection circuit, according to some embodiments of the present disclosure.

FIG. 11 is an illustration of an illustration of example waveforms 1100 for voltage supply selection circuit 1000, according to some embodiments of the present disclosure. As discussed above, for voltage supply selection circuit 1000, selection signal 210 is in the voltage domain of second voltage supply 270 (e.g., $V_{DD}$ voltage domain). In waveforms 1100, voltage V1 represents a voltage level of second voltage supply 270 when system 100 of FIG. 1 is in a normal mode of operation (e.g., when system 100 is not in a high performance mode of operation), voltage V2 represents a voltage level of first voltage supply 260, and voltage V3 represents a voltage level of second voltage supply 270 when system 100 is in the high performance mode of operation (e.g., to support a higher frequency to execute circuit operations faster). Voltage V3 can be at a voltage level higher than that of voltage V2, which can be at a voltage level higher than that of voltage V1. In some embodiments, the voltage level of first voltage supply 260 is substantially the same during the normal and high performance modes of operation for system 100.

During a time window 1110, selection signal 210 is at a logic high (e.g., voltage V1) and system 100 is in a normal mode of operation. Under these conditions, voltage supply 115 is electrically coupled to first voltage supply 260. Referring to FIG. 10, with selection signal 210 at a logic high (e.g., voltage V1), second control switch 240 outputs a logic low (e.g., 0 V). Specifically, second NAND circuit 1060 receives selection signal 210 at a first input and an output of first control switch 220 (which is at a logic high, as described below) at a second input. As a result, second NAND circuit 1060 outputs a logic low (e.g., 0 V). Second delay circuit 1020 receives the logic low output from second control switch 240 and outputs a logic low to second voltage supply switch 250. Specifically, fourth inverter circuit 1025 receives the logic low output from second NAND circuit 1060 and outputs a logic high (e.g., second voltage supply 270). Fifth inverter circuit 1027 receives the logic high output from fourth inverter circuit 1025 and outputs a logic low (e.g., 0 V). Second voltage supply switch 250 receives the logic low output from second control switch 240 and passes first voltage supply 260 to voltage supply 115. Specifically, p-type transistor 360 receives the logic low (e.g., 0 V) output from fifth inverter circuit 1027 at its gate terminal. As a result, p-type transistor 360 is on and passes first voltage supply 260 (e.g., voltage V2) to voltage supply 115.

Further, with selection signal 210 at a logic high (e.g., voltage V1), first control switch 220 outputs a logic high (e.g., first voltage supply 260). Specifically, level-shifter circuit 1030 receives a logic high from selection signal 210 (which is in the voltage domain of second voltage supply 270) and outputs a logic high in the voltage domain of first voltage supply 260. In turn, first inverter circuit 1040 receives the logic high output from level-shifter circuit 1030 and outputs a logic low (e.g., 0 V). First NAND circuit 1050 receives the logic low output from first inverter circuit 1040 at a first input and the logic low output from second control switch 240 at a second input—in which first NAND circuit 1050 outputs a logic high (e.g., first voltage supply 260). First delay circuit 1010 receives the logic high output from NAND circuit 1050 and outputs a logic high (e.g., first voltage supply 260). Specifically, second inverter circuit 1015 receives the logic high output from first NAND circuit 1050 and outputs a logic low (e.g., 0 V). Third inverter circuit 1017 receives the logic low output from second inverter circuit 1015 and outputs a logic high (e.g., voltage V2).

First voltage supply switch 230 receives the logic high output from first control switch 220, which prevents second voltage supply 270 from being passed to voltage supply 115. Specifically, p-type transistor 340 receives the logic high (e.g., voltage V2) output from third inverter circuit 1017 at its gate terminal. Because the first S/D terminal receives second voltage supply 270, which is lower than voltage V2 at the gate of p-type transistor 340, p-type transistor 340 is off and does not pass second voltage supply 270 to voltage supply 115.

During a time window 1120, selection signal 210 transitions from a logic high to a logic low and second voltage supply 270 transitions from voltage V1 to voltage V3 in preparation for a high performance mode of operation for system 100. Because selection signal 210 is in the voltage domain of second voltage supply 270 (e.g., $V_{DD}$ voltage domain), as second voltage supply 270 transitions from voltage V1 to voltage V3, selection signal 210 transitions in a similar manner while selection signal 210 is at a logic high. In some embodiments, selection signal 210 transitions from a logic high (e.g., voltage V2) to a logic low (e.g., 0 V) at a time 1150, which is a time when first voltage supply 260 and second voltage supply 270 are substantially at the same voltage level.

Referring to FIG. 10, with selection signal 210 at a logic low (e.g., 0 V), first control switch 220 outputs a logic low (e.g., 0 V). Specifically, level-shifter circuit 1030 receives a logic low from selection signal 210 and outputs a logic low (e.g., 0 V). In turn, first inverter circuit 1040 receives the logic low output from level-shifter circuit 1030 and outputs a logic high (e.g., first voltage supply 260). First NAND circuit 1050 receives the logic high output from first inverter circuit 1040 at a first input and a logic high from second control switch 240 (described below) at a second input. As a result, first NAND circuit 1050 outputs a logic low (e.g., 0 V). First delay circuit 1010 receives the logic low output from first NAND circuit 1050 and outputs a delayed version of the logic low. Specifically, second inverter circuit 1015 receives the logic low output from first NAND circuit 1050 and outputs a logic high (e.g., first voltage supply 260). Third inverter circuit 1017 receives the logic high output from second inverter circuit 1015 and outputs a logic low (e.g., 0 V)—thus outputting a delayed version of the logic low output from first NAND circuit 1050. An example of a time delay representative of the delayed version of the logic low output from first NAND circuit 1050 is shown as delay 1160 in FIG. 11, which shows a delay between an output of second control switch 240 (e.g., node 1029) transitioning from a logic low to a logic high and the output of control switch 220 (e.g., node 1019) transitioning from a logic high to a logic low. During delay 1160, because the outputs of first control switch 220 (e.g., node 1019) and second control switch 240 (e.g., node 1029) are at a logic high, p-type transistors 340 and 360 (in first and second voltage supply switches 230 and 250, respectively) are off at the same time thus preventing voltage supply 115 from receiving either first voltage supply 260 or second voltage supply 270 during the transition of selection signal 210.

Referring to FIG. 10, after delay 1160, first voltage supply switch 230 receives the logic low output from first control switch 220 and passes second voltage supply 270 to voltage supply 115. Specifically, after delay 1160, p-type transistor 340 receives the logic low (e.g., 0 V) output from third inverter circuit 1017 at its gate terminal. As a result, p-type transistor 340 is on and passes second voltage supply 270 (e.g., transitioning from voltage V1 to voltage V3) to voltage supply 115.

Further, with selection signal 210 at a logic low (e.g., 0 V), second control switch 240 outputs a logic high (e.g., second voltage supply 270). Specifically, second NAND circuit 1060 receives selection signal 210 at a first input and the output of first control switch 220 (e.g., node 1019) at a second input. Because selection signal 210 and the output of first control switch 220 are both at a logic low (e.g., 0 V), an output of second NAND circuit 1060 is at a logic high (e.g., second voltage supply 270). Second delay circuit 1020 receives the logic high output from second NAND circuit 1060 and outputs a logic high. Specifically, fourth inverter circuit 1025 receives the logic high output from second NAND circuit 1060 and outputs a logic low. Fifth inverter circuit 1027 receives the logic low output from fourth inverter circuit 1025 and outputs a logic high (e.g., second voltage supply 270).

Second voltage supply switch 250 receives the logic high output from second control switch 240, which prevents first voltage supply 260 from being passed to voltage supply 115. Specifically, p-type transistor 360 receives the logic high (e.g., second voltage supply 270) output from fifth inverter circuit 1027 at its gate terminal. At time 1150 of FIG. 11, first voltage supply 260 and second voltage supply 270 are at the same or substantially the same voltage level. As a result, p-type transistor 340 is off and prevents second voltage supply 270 (e.g., transitioning from voltage V1 to voltage V3) from being passed to voltage supply 115.

During a time window 1130, selection signal 210 is at a logic low and second voltage supply 270 is at voltage V3. Because second voltage supply 270 is passed to voltage supply 115 via first voltage supply switch 230, voltage supply 115 is at voltage V3. As a result, circuit 120 of FIG.

1 receives a higher voltage supply to facilitate a high performance mode of operation, where it can operate at a higher frequency to execute circuit operations faster.

During a time window 1140, selection signal 210 transitions from a logic low to a logic high and second voltage supply 270 transitions from voltage V3 to voltage V1 in preparation for a normal mode of operation for system 100. In some embodiments, selection signal 210 transitions from a logic low to a logic high at a time 1170, which is a time when first voltage supply 260 and second voltage supply 270 are substantially at the same voltage level. Because selection signal 210 is in the voltage domain of second voltage supply 270 (e.g., $V_{DD}$ voltage domain), as second voltage supply 270 transitions from voltage V3 to voltage V1, selection signal 210 transitions in a similar manner while selection signal 210 is at a logic high.

Referring to FIG. 10, with selection signal 210 at a logic high, first control switch 220 outputs a logic high (e.g., first voltage supply 260). Specifically, level-shifter circuit 1030 receives a logic high from selection signal 210 and outputs a logic high (e.g., first voltage supply 260). In turn, first inverter circuit 1040 receives the logic high output from level-shifter circuit 1030 and outputs a logic low (e.g., 0 V). First NAND circuit 1050 receives the logic low output from first inverter circuit 1040 at a first input and the output of second control switch 240 (e.g., node 1029) at a second output. Because the output of first inverter circuit 1040 and the output of second control switch 240 are both at a logic low (e.g., 0 V), first NAND circuit 1050 outputs a logic high (e.g., first voltage supply 260). First delay circuit 1010 receives the logic high output from first NAND circuit 1050 and outputs a logic high. Specifically, second inverter circuit 1015 receives the logic high output from first NAND circuit 1050 and outputs a logic low. Third inverter circuit 1017 receives the logic tow output from second inverter circuit 1015 and outputs a logic high (e.g., first voltage supply 260).

First voltage supply switch 230 receives the logic high output from first control switch 220, which prevents second voltage supply 270 from being passed to voltage supply 115. Specifically, p-type transistor 340 receives the logic high (e.g., first voltage supply 260) output from third inverter circuit 1017 at its gate terminal. At time 1170, first voltage supply 260 and second voltage supply 270 are at the same or at substantially the same voltage level. As a result, p-type transistor 340 is off and does not pass second voltage supply 270 to voltage supply 115.

Further, with selection signal 210 at a logic high, second control switch 240 outputs a logic low (e.g., 0 V). Specifically, second NAND circuit 1060 receives selection signal 210 at a first input and the output of first control switch 220 (e.g., node 1019) at a second input. Because selection signal 210 and the output of first control switch 220 are both at a logic high (e.g., second voltage supply 270), an output of second NAND circuit 1060 is at a logic tow (e.g., 0 V). Second delay circuit 1020 receives the logic low output from second NAND circuit 1060 and outputs a delayed version of the logic low. Specifically, fourth inverter circuit 1025 receives the logic low output from second NAND circuit 1060 and outputs a logic high (e.g., second voltage supply 270). Fifth inverter circuit 1027 receives the logic high output from fourth inverter circuit 1025 and outputs a logic low (e.g., 0 V)—thus outputting a delayed version of the logic low output from second NAND circuit 1060. An example of a time delay representative of the delayed version of the logic low output from second NAND circuit 1060 is shown as a delay 1180 in FIG. 11, which shows a delay between the output of first control switch 220 (e.g., node 1019) transitioning from a logic low to a logic high and the output of second control switch 240 (e.g., node 1029) transitioning from a logic high to a logic low. During delay 1180, because the outputs of first control switch 220 (e.g., node 1019) and second control switch 240 (e.g., node 1029) are at a logic high, p-type transistors 340 and 360 (in first and second voltage supply switches 230 and 250, respectively) are off at the same time—thus preventing voltage supply 115 from receiving either first voltage supply 260 or second voltage supply 270 during the transition of selection signal 210.

After delay 1180, second voltage supply switch 250 receives the logic low output from second control switch 240 and passes first voltage supply 260 to voltage supply 115. Specifically, after delay 1180, p-type transistor 360 receives the logic low (e.g., 0 V) output from fifth inverter circuit 1027 at its gate terminal. As a result, p-type transistor 360 is on and passes first voltage supply 260 to voltage supply 115.

Figure 12:
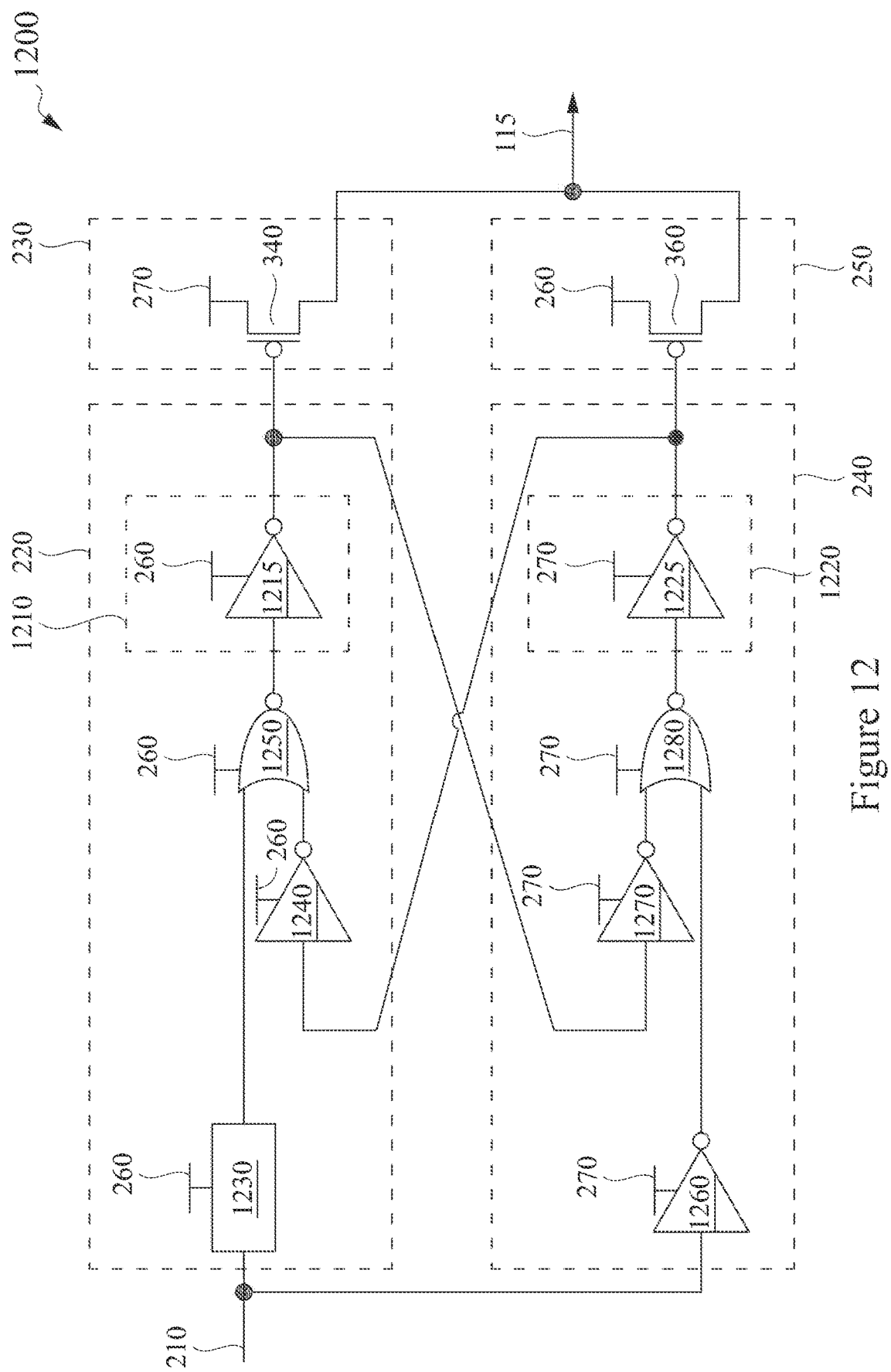
FIG. 12 is an illustration of a sixth circuit-level representation of a voltage supply selection circuit, according to some embodiments of the present disclosure.

FIG. 12 is an illustration of a sixth circuit-level representation of a voltage supply selection circuit 1200, according to some embodiments of the present disclosure. Voltage supply selection circuit 1200 can represent voltage supply selection circuit 110 of FIGS. 1 and 2. In this example, selection signal 210 is in the voltage domain of second voltage supply 270 (e.g., $V_{DD}$ voltage domain). For example, when selection signal 210 is at a logic high, selection signal 210 is at the voltage level of second voltage supply 270 (e.g., $V_{DD}$ voltage level). And, when selection signal 210 is at a logic low, selection signal 210 is at ground (e.g., 0 V).

First control switch 220 includes a level-shifter circuit 1230, a first inverter circuit 1240, a first NOR circuit 1250, and first delay circuit 1210. Level-shifter circuit 1230 receives (or is electrically coupled to) selection signal 210. In some embodiments, level-shifter circuit 1230 sets a voltage level of selection signal 210 to be in the same voltage domain as first voltage supply 260 (e.g., $V_{DDM}$ voltage domain) at its output. For example, if selection signal 210 is at a logic high (e.g., $V_{DD}$ voltage level), level-shifter circuit 1230 outputs a logic high in the voltage domain of first voltage supply 260 (e.g., $V_{DDM}$ voltage level). Conversely, if selection signal 210 is at a logic low (e.g., 0 V), level-shifter circuit 1230 outputs ground (e.g., 0 V). First inverter circuit 1240 receives (or is electrically coupled to) and inverts an output of second control switch 240. First NOR circuit 950 receives (or is electrically coupled to) the output of level-shifter circuit 1230 at a first input and receives (or is electrically coupled to) an output of first inverter circuit 1240 at a second input. First delay circuit 1210 receives (or is electrically coupled to) an output of first NOR circuit 1250. First delay circuit 1210 includes a second inverter circuit 1215, which receives (or is electrically coupled to) and inverts an output of first NOR circuit 1250. First voltage supply switch 230 in voltage supply selection circuit 1200 has the same circuit-level representation as first voltage supply switch 230 in voltage supply selection circuit 300 of FIG. 3.

Second control switch 240 includes third inverter circuit 1260, a fourth inverter circuit 1270, a second NOR circuit 1280, and a second delay circuit 1220. Third inverter circuit 1260 receives (or is electrically coupled to) and inverts selection signal 210. Fourth inverter circuit 1210 receives (or is electrically coupled to) and inverts an output of first control switch 220. Second NOR circuit 1280 receives (or is electrically coupled to) an output of third inverter circuit 1260 at a first input and receives (or is electrically coupled to) an output of fourth inverter circuit 1270 at a second input. Second delay circuit 1220 receives (or is electrically coupled to) an output of second NOR circuit 1280. Second delay circuit 1220 includes a fifth inverter circuit 1225, which receives (or is electrically coupled to) and inverts an outputs of second NOR circuit 1280. Second voltage supply switch 250 in voltage supply selection circuit 1200 has the same circuit-level representation as second voltage supply switch 250 in voltage supply selection circuit 300 of FIG. 3.

Voltage supply selection circuit 1200 of FIG. 12 operates in a similar manner as that of voltage supply selection circuit 1000 of FIG. 10. For example, referring to waveforms 1100 of FIG. 11, delays 1160 and 1180 occur as a result of the delays caused by delay circuits 1210 and 1220 of FIG. 12. During delays 1160 and 1180, first and second voltage supply switches 230 and 250 are off at the same time—thus preventing voltage supply 115 from receiving either first voltage supply 260 or second voltage supply 270 during the transition of selection signal 210. After delay 1160, first voltage supply switch 230 is on. And, after delay 1180, second voltage supply switch 250 is on.

Figure 13:
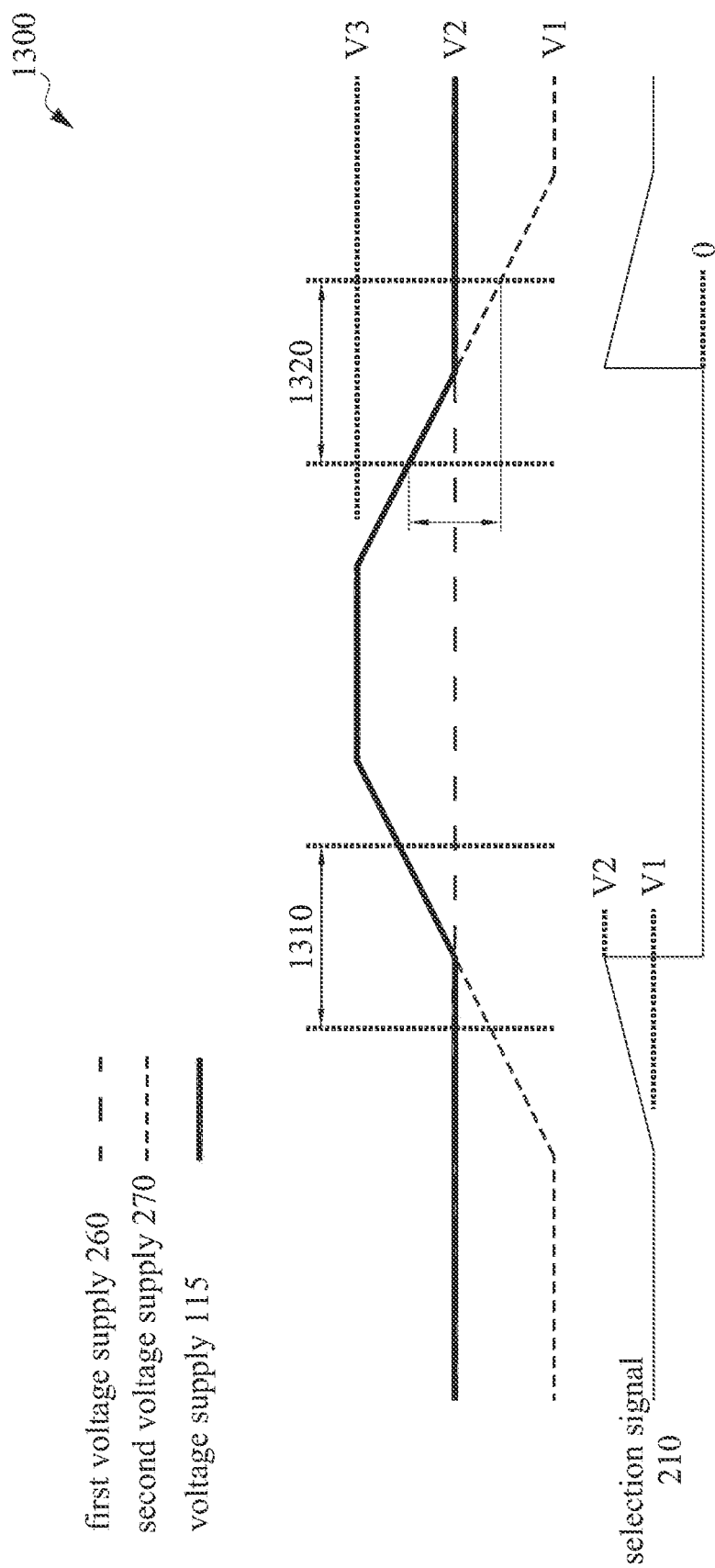
FIG. 13 is an illustration of example waveforms to optimize a selection signal switching window for a voltage supply selection circuit, according to some embodiments of the present disclosure.

FIG. 13 is an illustration of an illustration of example waveforms 1300 to optimize a selection signal switching window for a voltage supply selection circuit, according to some embodiments of the present disclosure. In this example, selection signal 210 is in the voltage domain of second voltage supply 270 (e.g., $V_{DD}$ voltage domain). In waveforms 1300, voltage V1 represents a voltage level of second voltage supply 270 when system 100 of FIG. 1 is in a normal mode of operation (e.g., when system 100 is not in a high performance mode of operation), voltage V2 represents a voltage level of first voltage supply 260, and voltage V3 represents a voltage level of second voltage supply 270 when system 100 is in the high performance mode of operation (e.g., to support a higher frequency to execute circuit operations faster). Voltage V3 can be at a voltage level higher than that of voltage V2, which can be at a voltage level higher than that of voltage V1. In some embodiments, the voltage level of first voltage supply 260 is substantially the same during the normal and high performance modes of operation for system 100.

Switching window 1310 refers to a window of times when selection signal 210 should transition from a logic high to a logic low to minimize leakage current. Switching window 1320 refers to a window of times when selection signal 210 should transition from a logic low to a logic high to minimize leakage current. In some embodiments, switching windows 1310 and 1320 can be based on a voltage differential between first voltage supply 260 and second voltage supply 270 at different points in time. In some embodiments, switching windows 1310 and 1320 can be set based on the following condition:

voltage supply 115>|(first voltage supply 260)−(second voltage supply 270)|. Put differently, in some embodiments, selection signal 210 should transition from a logic high to a logic low—or vice versa—in a window of time when a voltage level of voltage supply 115 is greater than an absolute value of a difference between first voltage supply 260 and second voltage supply 270. In some embodiments, if selection signal 210 transitions within these conditions, then leakage current can be minimized, thus reducing power consumption.

Figure 14:
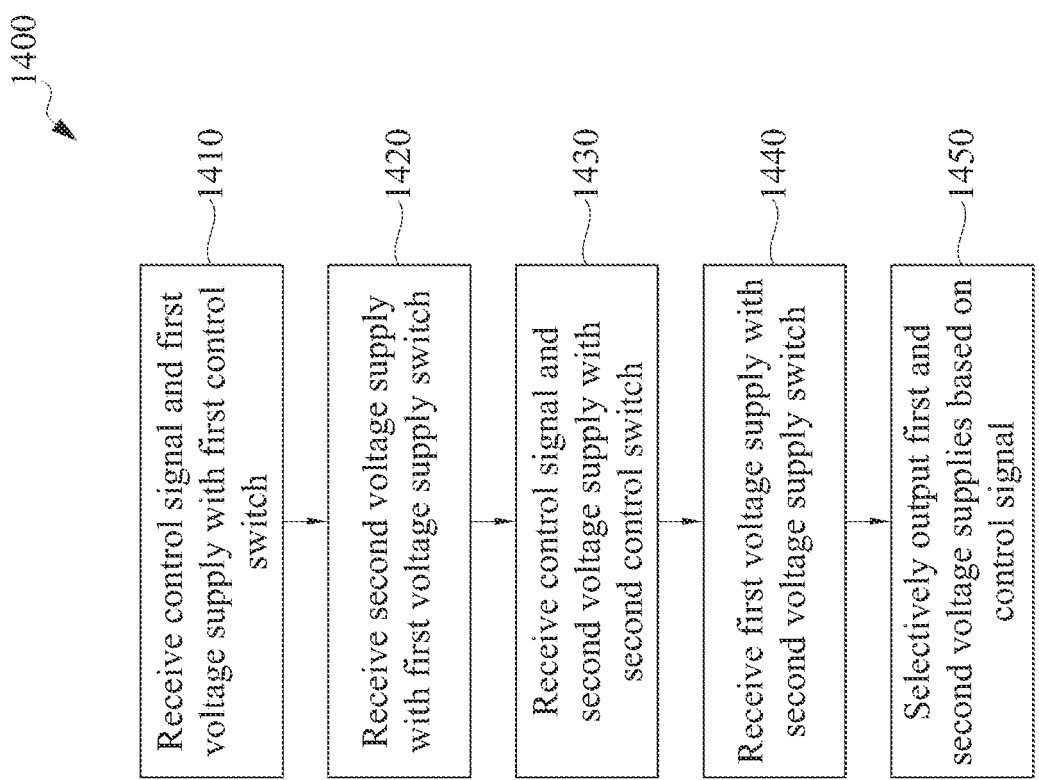
FIG. 14 is an illustration of a method for selecting a voltage supply, according to some embodiments of the present disclosure.

FIG. 14 is an illustration of a method 1400 for selecting a voltage supply, according to some embodiments of the present disclosure. The operations depicted in method 1400 can be performed by, for example, system 100 of FIG. 1, voltage supply selection circuit 110 of FIG. 2, voltage supply selection circuit 300 of FIG. 3, voltage supply selection circuit 500 of FIG. 5, voltage supply selection circuit 700 of FIG. 7, voltage supply selection circuit 900 of FIG. 9, voltage supply selection circuit 1000 of FIG. 10, and voltage supply selection circuit 1200 of FIG. 12. It is to be appreciated that not all operations may be needed to perform the disclosure provided herein and that one or more additional operations may be performed. Further, some of the operations may be performed concurrently or in a different order than shown in FIG. 14.

In operation 1410, a control signal and a first voltage supply is received by a first control switch. For example, referring to FIG. 2, first control switch 220 receives selection signal 210 (also referred to herein as "control signal 210") and first voltage supply 260. In some embodiments, first control switch 220 can also receive an output of second control switch 240, as shown in voltage supply selection circuit 700 of FIG. 7, voltage supply selection circuit 900 of FIG. 9, voltage supply selection circuit 1000 of FIG. 10, and voltage supply selection circuit 1200 of FIG. 12.

In operation 1420, a second voltage supply is received by a first voltage supply switch that is electrically coupled to the first control switch. For example, referring to FIG. 2, first voltage supply switch 230 receives second voltage supply 270 and is electrically coupled to first control switch 220.

In operation 1430, the control signal and the second voltage supply are received by a second control switch. For example, referring to FIG. 2, second control switch 240 receives selection signal 210 (or control signal 210) and second voltage supply 270. In some embodiments, second control switch 240 can also receive an output of first control switch 220, as shown in voltage supply selection circuit 700 of FIG. 7, voltage supply selection circuit 900 of FIG. 9, voltage supply selection circuit 1000 of FIG. 10, and voltage supply selection circuit 1200 of FIG. 12.

In operation 1440, the first voltage supply is received by a second voltage supply switch that is electrically coupled to the second control switch. For example, referring to FIG. 2, second voltage supply switch 250 receives first voltage supply 260 and is electrically coupled to second control switch 240.

As for operations 1410 and 1430, based on the outputs from an opposite first and second control switches 230 and 240, first and second control switches 230 and 240 can create a timing delay with delay circuit (e.g., delay circuit 710 of FIG. 7, first delay circuit 910 of FIG. 9, delay circuit 1010 of FIG. 10, and delay circuit 1210 of FIG. 12) such that first and second voltage supply switches 230 and 250 are activated or de-activated for a period of time when selection signal 210 (or control signal 210) transitions from a logic high to a logic low or vice versa.

Returning to method 1400 of FIG. 14, in operation 1450, the first and second voltage supplies are selectively outputted based on the control signal. For example, referring to waveforms 400 of FIG. 4, waveforms 600 of FIG. 6, waveforms 800 of FIG. 8, waveforms 1100 of FIG. 11, and waveforms 1300 of FIG. 13, first voltage supply 260 and second voltage supply 270 can be selectively outputted to voltage supply 115 based on selection signal 210 (or control signal 210).

Embodiments of the present disclosure describe a voltage supply selection circuit that can increase or decrease a supply voltage depending on a selection signal (or control signal). For example, when increasing a voltage supply to support a system's high performance mode operation (e.g., at a higher frequency to execute circuit operations faster), embodiments of the present disclosure increase a single supply voltage—rather than increase multiple supply voltages—thus simplifying circuit design. And, when decreasing the voltage supply to reduce a system's power consumption, embodiments of the present disclosure decrease a single supply voltage—rather than decrease multiple supply voltages—thus again simplifying circuit design.

Embodiments of the present disclosure describe a circuit for selecting a voltage supply. The circuit includes a first control switch, a first voltage supply switch, a second control switch, and a second voltage supply switch. The first control switch is configured to receive a control signal and a first voltage supply. The first voltage supply switch is electrically coupled to the first control switch and is configured to receive a second voltage supply. The second voltage supply switch is electrically coupled to the second control switch and configured to receive the first voltage supply. The first and second voltage supply switches are configured to selectively output the first and second voltage supplies based on the control signal.

Embodiments of the present disclosure describe a system for selecting a voltage supply. The system includes a circuit (e.g., a processor) and a voltage supply selection electrically coupled to the circuit. The circuit is configured to receive a voltage supply. The voltage supply selection circuit is configured to selectively provide a first voltage supply and a second voltage supply as the voltage supply to the circuit. The voltage supply selection circuit includes a first control switch, a first voltage supply switch, a second control switch, and a second voltage supply switch. The first control switch is configured to receive a control signal and a first voltage supply. The first voltage supply switch is electrically coupled to the first control switch and is configured to receive a second voltage supply. The second voltage supply switch is electrically coupled to the second control switch and configured to receive the first voltage supply. The first and second voltage supply switches are configured to selectively output the first and second voltage supplies based on the control signal.

Embodiments of the present disclosure describe a method for selecting a voltage supply. The method includes: receiving, with a first switch, a selection signal and a first voltage; receiving, with a second switch electrically coupled to the first switch, a second voltage supply; receiving, with a third switch, the selection signal and the second voltage; receiving, with a fourth switch electrically coupled to the third switch, the first voltage; and, transitioning a voltage supply from the first voltage to the second voltage in response to the selection signal transitioning from a first logic level to a second logic level and in response to the first and second voltages being substantially at the same voltage level. The method further includes: receiving, with the first control switch, an output of the second control switch; and receiving, with the second control switch, an output of the first control switch.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A circuit, comprising:
   a first control switch configured to receive a control signal and a first voltage supply;
   a first voltage supply switch electrically coupled to the first control switch and configured to receive a second voltage supply;
   a second control switch configured to receive the control signal and the second voltage supply; and
   a second voltage supply switch electrically coupled to the second control switch and configured to receive the first voltage supply, wherein the first and second voltage supply switches are configured to selectively output the first and second voltage supplies based on the control signal, and wherein, prior to the circuit transitioning between the first and second voltage supplies, the control signal is configured to transition from a first voltage level to a second voltage level while in a logic high state.

2. The circuit of claim 1, wherein the first control switch comprises a level-shifter circuit configured to receive the control signal and electrically coupled to an inverter circuit, and wherein the level-shifter circuit and the inverter circuit are configured to receive the first voltage supply.

3. The circuit of claim 1, wherein the first voltage supply switch comprises a p-type transistor with a gate terminal, a first source/drain (S/D) terminal, and a second S/D terminal, and wherein the p-type transistor is configured to:
   receive an output of the first control switch at the gate terminal;
   receive the second voltage supply at the first S/D terminal; and
   output the second voltage supply at the second S/D terminal.

4. The circuit of claim 1, wherein the second control switch comprises a logic circuit configured to receive the control signal and the second voltage supply.

5. The circuit of claim 4, wherein the logic circuit comprises a NOR circuit.

6. The circuit of claim 1, wherein the second control voltage supply switch comprises a p-type transistor with a gate terminal, a first S/D terminal, and a second S/D terminal, and wherein the p-type transistor is configured to:
   receive an output of the second control switch at the gate terminal;
   receive the first voltage supply at the first S/D terminal; and
   output the first voltage supply at the second S/D terminal.

7. The circuit of claim 1, wherein the first control switch comprises a first output electrically coupled to an input to the second control switch, and wherein the second control switch comprises a second output electrically coupled to an input to the first control switch.

8. The circuit of claim 7, wherein each of the first and second control switches comprises a delay circuit.

9. The circuit of claim 8, wherein the delay circuit comprises one or more inverter circuits.

10. A system, comprising:
    a circuit configured to receive a voltage supply; and a voltage supply selection circuit electrically coupled to the circuit and configured to selectively provide a first voltage supply and a second voltage supply as the voltage supply to the circuit, wherein the voltage supply selection circuit comprises:
- a first control switch configured to receive a control signal and the first voltage supply;
- a first voltage supply switch electrically coupled to the first control switch and configured to receive the second voltage supply;
- a second control switch configured to receive the control signal and the second voltage supply; and
- a second voltage supply switch electrically coupled to the second control switch and configured to receive the first voltage supply, wherein the first and second voltage supply switches are configured to selectively output the first and second voltage supplies based on the control signal, and wherein the control signal is configured to transition from a first voltage level to a higher second voltage level while in a logic high state.

11. The system of claim 10, wherein the circuit comprises a processor.

12. The system of claim 10, wherein the first control switch comprises a level-shifter circuit configured to receive the control signal and electrically coupled to an inverter circuit, and wherein the level-shifter circuit and the inverter circuit are configured to receive the first voltage supply.

13. The system of claim 10, wherein the first voltage supply switch comprises a p-type transistor with a gate terminal, a first source/drain (S/D) terminal, and a second S/D terminal, and wherein the p-type transistor is configured to:
- receive an output of the first control switch at the gate terminal;
- receive the second voltage supply at the first S/D terminal; and
- output the second voltage supply at the second S/D terminal.

14. The system of claim 10, wherein the second control switch comprises a logic circuit configured to receive the control signal and the second voltage supply.

15. The system of claim 14, wherein the logic circuit comprises a NOR circuit.

16. The system of claim 10, wherein the second voltage supply switch comprises a p-type transistor with a gate terminal, a first S/D terminal, and a second S/D terminal, and wherein the p-type transistor is configured to:
- receive an output of the second control switch at the gate terminal;
- receive the first voltage supply at the first S/D terminal; and
- output the first voltage supply at the second S/D terminal.

17. The system of claim 10, wherein the first control switch comprises a first output electrically coupled to an input to the second control switch, and wherein the second control switch comprises a second output electrically coupled to an input to the first control switch.

18. A method, comprising:
- receiving, with a first switch, a selection signal and a first voltage;
- receiving, with a second switch electrically coupled to the first switch, a second voltage;
- receiving, with a third switch, the selection signal and the second voltage;
- receiving, with a fourth switch electrically coupled to the third switch, the first voltage; and
- transitioning a voltage supply from the first voltage to the second voltage in response to the selection signal transitioning from a first logic level to a second logic level and in response to the first and second voltages being substantially at the same voltage level, wherein the selection signal is configured to transition from a first voltage to a second voltage while in the first logic level.

19. The method of claim 18, wherein receiving the selection signal and first voltage comprises receiving, with the first switch, an output of the third switch, and wherein receiving the selection signal and the second voltage comprises receiving, with the third switch, an output of the first switch.

20. The method of claim 19, wherein receiving the outputs of the first and third switches comprises activating or de-activating the third and fourth switches concurrently for a period of time.

* * * * *

UNITED STATES PATENT AND TRADEMARK OFFICE
CERTIFICATE OF CORRECTION

| | |
|---|---|
| PATENT NO. | : 11,728,789 B2 |
| APPLICATION NO. | : 17/406273 |
| DATED | : August 15, 2023 |
| INVENTOR(S) | : Kuo et al. |

It is certified that error appears in the above-identified patent and that said Letters Patent is hereby corrected as shown below:

In the Claims

In Column 24, Claim 6, Line 48, after "second", delete "control".

Signed and Sealed this
Twenty-eighth Day of November, 2023

Katherine Kelly Vidal
*Director of the United States Patent and Trademark Office*